(12) United States Patent
Ellis-Monaghan et al.

(10) Patent No.: US 9,087,808 B2
(45) Date of Patent: Jul. 21, 2015

(54) FABRICATING POLYSILICON MOS DEVICES AND PASSIVE ESD DEVICES

(71) Applicant: International Business Machines Corporation, Armonk, NY (US)

(72) Inventors: John J. Ellis-Monaghan, Grand Isle, VT (US); Michael J. Hauser, Bolton, VT (US); Zhong-Xiang He, Essex Junction, VT (US); Junjun Li, Williston, VT (US); Xuefeng Liu, South Burlington, VA (US); Anthony K. Stamper, Williston, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/451,836

(22) Filed: Aug. 5, 2014

(65) Prior Publication Data
US 2014/0339607 A1   Nov. 20, 2014

Related U.S. Application Data

(62) Division of application No. 13/733,243, filed on Jan. 3, 2013.

(51) Int. Cl.
*H01L 29/00* (2006.01)
*H01L 21/36* (2006.01)
(Continued)

(52) U.S. Cl.
CPC ............ *H01L 21/36* (2013.01); *B81C 1/00246* (2013.01); *H01L 21/84* (2013.01); *H01L 27/1203* (2013.01); *B81C 2203/0714* (2013.01); *B81C 2203/0742* (2013.01)

(58) Field of Classification Search
CPC ....... H01L 29/00; H01L 29/84; H01L 29/882; H01L 29/7376; H01L 29/7606
USPC ...................................................... 257/25, 254
See application file for complete search history.

(56) References Cited

U.S. PATENT DOCUMENTS

| | | |
|---|---|---|
| 6,531,331 B1 | 3/2003 | Bennett et al. |
| 7,052,941 B2 | 5/2006 | Lee |

(Continued)

OTHER PUBLICATIONS

Gaillardon et al., "Can We Go Towards True 3-D Architectures?", DAC'11, Jun. 5-10, 2011, pp. 282-283.

(Continued)

*Primary Examiner* — Monica D Harrison
(74) *Attorney, Agent, or Firm* — Michael J. LeStrange; Robert Mlotkowski Safran & Cole, P.C.

(57) ABSTRACT

A semiconductor fabrication is described, wherein a MOS device and a MEMS device is fabricated simultaneously in the BEOL process. A silicon layer is deposited and etched to form a silicon film for a MOS device and a lower silicon sacrificial film for a MEMS device. A conductive layer is deposited atop the silicon layer and etched to form a metal gate and a first upper electrode. A dielectric layer is deposited atop the conductive layer and vias are formed in the dielectric layer. Another conductive layer is deposited atop the dielectric layer and etched to form a second upper electrode and three metal electrodes for the MOS device. Another silicon layer is deposited atop the other conductive layer and etched to form an upper silicon sacrificial film for the MEMS device. The upper and lower silicon sacrificial films are then removed via venting holes.

9 Claims, 26 Drawing Sheets

(51) Int. Cl.
*H01L 21/84* (2006.01)
*H01L 27/12* (2006.01)
*B81C 1/00* (2006.01)

(56) References Cited

U.S. PATENT DOCUMENTS

| | | |
|---|---|---|
| 7,382,056 B2 | 6/2008 | Chiu et al. |
| 7,598,550 B2 | 10/2009 | Yun |
| 7,602,027 B2 | 10/2009 | Burke et al. |
| 7,709,912 B2 | 5/2010 | Sato et al. |
| 7,772,046 B2 | 8/2010 | Pagaila et al. |
| 8,114,757 B1 | 2/2012 | Or-Bach et al. |
| 8,525,389 B2 * | 9/2013 | Tan et al. .............. 310/328 |
| 8,558,330 B2 * | 10/2013 | Yu et al. ............... 257/419 |
| 2009/0212420 A1 | 8/2009 | Hedler et al. |
| 2014/0183753 A1 | 7/2014 | Ellis-Monaghan et al. |

OTHER PUBLICATIONS

Kaneko et al., "A Novel BEOL Transistor (BETr) with InGaZnO Embedded in Cu-Interconnects for On-chip High Voltage I/Os in Standard CMOS LSIs", 2011 Symposium on VLSI Technology Digest of Technical Papers, pp. 120-121.

Ker et al., "Evaluation on ESD Robustness of LTPS Diode and TFT Device by Transmission Line Pulsing (TLP) Technique", Copyright 2003 IEEE, pp. 88-91.

Zhu, "Modeling of a-Si:H TFT I-V Characteristics in the Forward Subthreshold Operation", A thesis presented to the University of Waterloo in fulfillment of the thesis requirement for the degree of Master of Applied Science in Electrical and Computer Engineering, Waterloo, Ontario, Canada, 2005, 82 pages.

* cited by examiner

FABRICATING POLYSILICON MOS DEVICES AND PASSIVE ESD DEVICES

CLAIM OF PRIORITY TO A CO-PENDING APPLICATION

The current application is a divisional application of pending application Ser. No. 13/733,243 filed Jan. 3 ,2013. The entire disclosure of pending application Ser. No. 13/733,243 (including figures) is germane to the invention as claimed in this current divisional application Ser. No. 14/451,836 filed Aug. 5, 2014.

FIELD OF THE INVENTION

The present invention relates generally to semiconductor fabrication, and more particularly to integrating the fabrication of polysilicon MOS devices and passive ESD diodes into the back end of line process.

BACKGROUND

The fabrication of semiconductor devices involves forming electronic components in and on semiconductor substrates, such as silicon wafers. These electronic components may include one or more conductive layers, one or more insulation layers, and doped regions formed by implanting various dopants into portions of a semiconductor substrate to achieve specific electrical properties. Semiconductor devices include transistors, resistors, capacitors, and the like, with intermediate and overlying metallization patterns at varying levels, separated by dielectric materials, which interconnect the semiconductor devices to form integrated circuits.

The semiconductor fabrication process is broken down into two parts, the front end of line (FEOL) process and the back end of line (BEOL) process. The FEOL process is the first portion of the semiconductor fabrication process. Typically, during the FEOL process, the individual devices, such as the transistors, capacitors and resistors, desired for the semiconductor device, are patterned in the semiconductor. The FEOL process generally covers everything up to, but not including, the deposition of the metal interconnect layers of the semiconductor device.

The BEOL process is the second portion of the semiconductor fabrication process. After the FEOL process, there is a wafer with isolated transistors (without any wires). The wafer then moves into the BEOL process, where contact pads, interconnect wires, vias, and dielectric structures are formed.

As stated above, individual devices, such as field-effect transistors, are typically patterned in the semiconductor during the FEOL process. Field-effect transistors (FETs), such as metal-oxide-semiconductor FETs (MOSFETs), are a commonly used semiconductor device. Generally, a FET has three terminals, i.e., a gate (or gate stack), a source region, and a drain region. In some instances, the body of the semiconductor may be considered a fourth terminal. The gate stack is a structure used to control output current, i.e., flow of carriers in the channel portion of a FET, through electrical or magnetic fields. The channel portion of the substrate is the region between the source region and the drain region of a semiconductor device that becomes conductive when the semiconductor device is turned on. The source region is a doped region in the semiconductor device from which majority carriers are flowing into the channel portion. The drain region is a doped region in the semiconductor device located at the end of the channel portion, in which carriers are flowing into, from the source region via the channel portion, and out of the semiconductor device through the drain region. A conductive plug, or contact, is electrically coupled to each terminal. One contact is made to the source region, one contact is made to the drain region, and one contact is made to the gate.

SUMMARY

Embodiments of the invention include a method and apparatus for integrating fabrication of a metal oxide semiconductor (MOS) device and microelectromechanical system (MEMS) device into a back end of the line (BEOL) process. A first layer of semiconductor substrate is formed. A first dielectric layer is deposited above the semiconductor substrate. A first conductive layer is deposited above the first dielectric layer. The first conductive layer is etched to form a first electrode for the MEMS device. A second dielectric layer is deposited around the first electrode. A second layer of semiconductor substrate is deposited on the second dielectric layer. The second layer of semiconductor substrate is etched to form a first semiconductor film for the MEMS device and a second semiconductor film for the MOS device.

A third dielectric layer is deposited around the first semiconductor film and the second semiconductor film. A portion of the second semiconductor film is doped to form a source region and a drain region in the second semiconductor film. An insulating layer is deposited above the third dielectric layer. The insulating layer is etched to form an insulator above the un-doped portion of the second semiconductor film. A second conductive layer is deposited above the insulator and the third dielectric layer. The second conductive layer is etched away to form a second electrode above the insulator and a third electrode above the first semiconductor film.

A fourth dielectric layer is deposited above and around the second electrode and third electrode. A first via is etched through the fourth dielectric layer to the source region in the second semiconductor film. A second via is etched through the fourth dielectric layer to the drain region in the second semiconductor film. A third via is etched through the fourth dielectric layer to the second electrode. A fourth and a fifth via is etched through the fourth dielectric layer to the third electrode. A conductive material is deposited in the first, second, third, fourth and fifth vias. A third conductive layer is deposited above the fourth dielectric layer. The third conductive layer is etched to form a fourth electrode above the fourth and fifth vias, a fifth electrode above the first via, a sixth electrode above the second via, and a seventh electrode over the third via. A third layer of semiconductor substrate is deposited above and around the fourth electrode, the fifth electrode, the sixth electrode, and the seventh electrode. The third layer of semiconductor substrate is etched to form a third semiconductor film above the fourth electrode. A fifth dielectric layer is deposited above the third semiconductor film, and the fifth, sixth and seventh electrodes. The first semiconductor film and the third semiconductor film is etched away.

DETAILED DESCRIPTION

Figure 1:
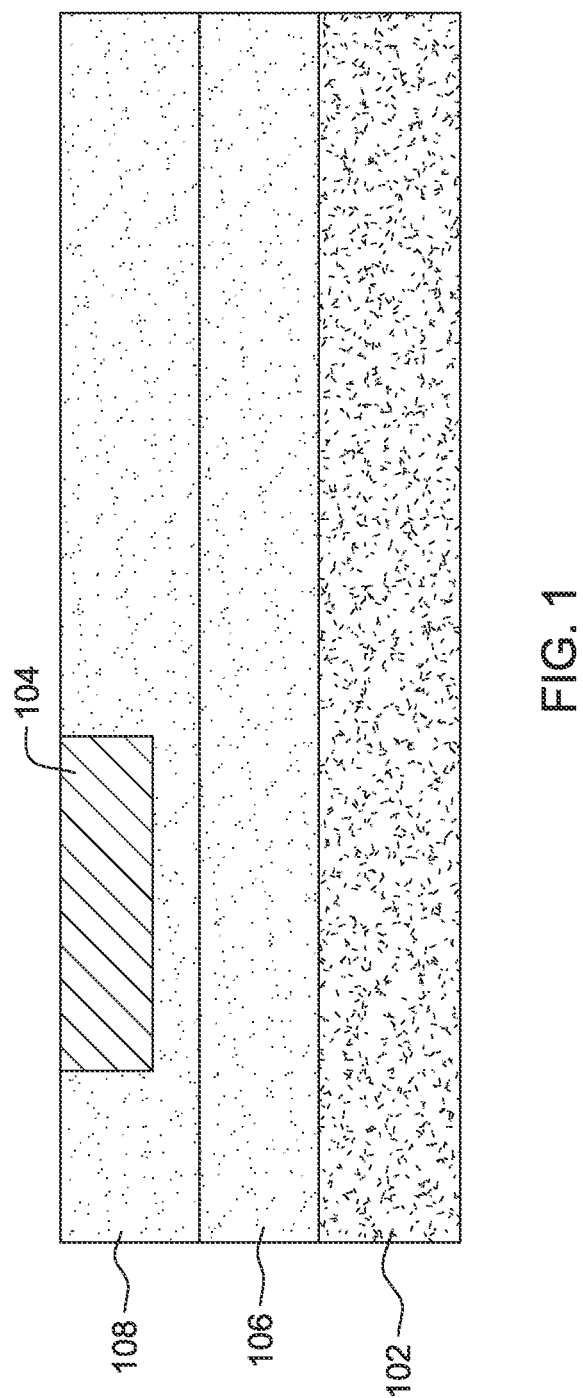
FIG. 1 depicts a semiconductor wafer with a MEMS lower electrode, in accordance with an embodiment of the invention.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

FIG. 1 depicts a semiconductor wafer with a MEMS lower electrode, in accordance with an exemplary embodiment of the invention. FIG. 1 contains silicon substrate 102, interlayer dielectric 106, and interlayer dielectric 108 which contains MEMS lower electrode 104 embedded within the layer. In the exemplary embodiment, FIG. 1 represents the starting point of the back end of line (BEOL) process for this invention. As mentioned above, typically the FEOL process is where the individual devices (such as transistors, resistors, capacitors, etc.) are patterned into the semiconductor, and the BEOL process is where the individual devices are inter-connected and dielectric layer are deposited. However, as depicted in FIG. 1, in the exemplary embodiment, the BEOL process starts with a wafer, which contains no individual devices patterned in. As described in detail below, in the exemplary embodiment of the invention, the fabrication of a MEMS device and a MOS device is integrated into the BEOL portion of the semiconductor fabrication process.

In the exemplary embodiment, silicon substrate 102 is composed of silicon, however, in other embodiments, silicon substrate 102 can be composed of glass or plastic. In the exemplary embodiment, interlayer dielectric 106 and interlayer dielectric 108 are composed of silicon dioxide. Interlayer dielectric 106 contains BEOL wires, which are used to connect individual devices such as transistors, capacitors and resistors. Interlayer dielectric 108 contains MEMS lower electrode 104, which is composed of a metal, such as tungsten, aluminum, titanium nitride or tantalum, and is embedded within interlayer dielectric 108 as depicted in FIG. 1. In other embodiments, the first or second dielectric layer contains two metal reflectors, located underneath the silicon film of the MOS device, which is discussed in further detail below. In the exemplary embodiment, the metal reflectors are composed of tungsten, however, in other embodiments, the metal reflectors may be composed of other metals such as aluminum, copper or gold.

Figure 2:
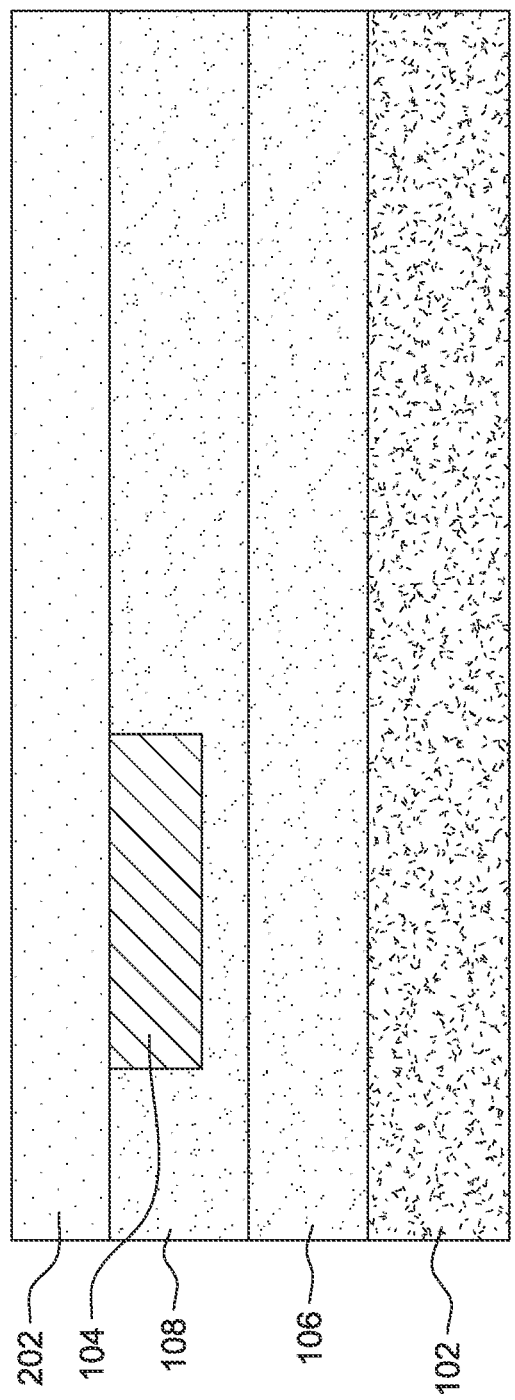
FIG. 2 depicts a first silicon layer deposited on the semiconductor wafer, in accordance with an embodiment of the invention.

FIG. 2 depicts a first silicon layer, silicon layer 202, deposited on the semiconductor wafer depicted in FIG. 1, in accordance with the exemplary embodiment of the invention. In the exemplary embodiment, silicon layer 202 is deposited atop interlayer dielectric 108 and MEMS lower electrode 104 by way of chemical vapor deposition or physical vapor deposition.

Figure 3:
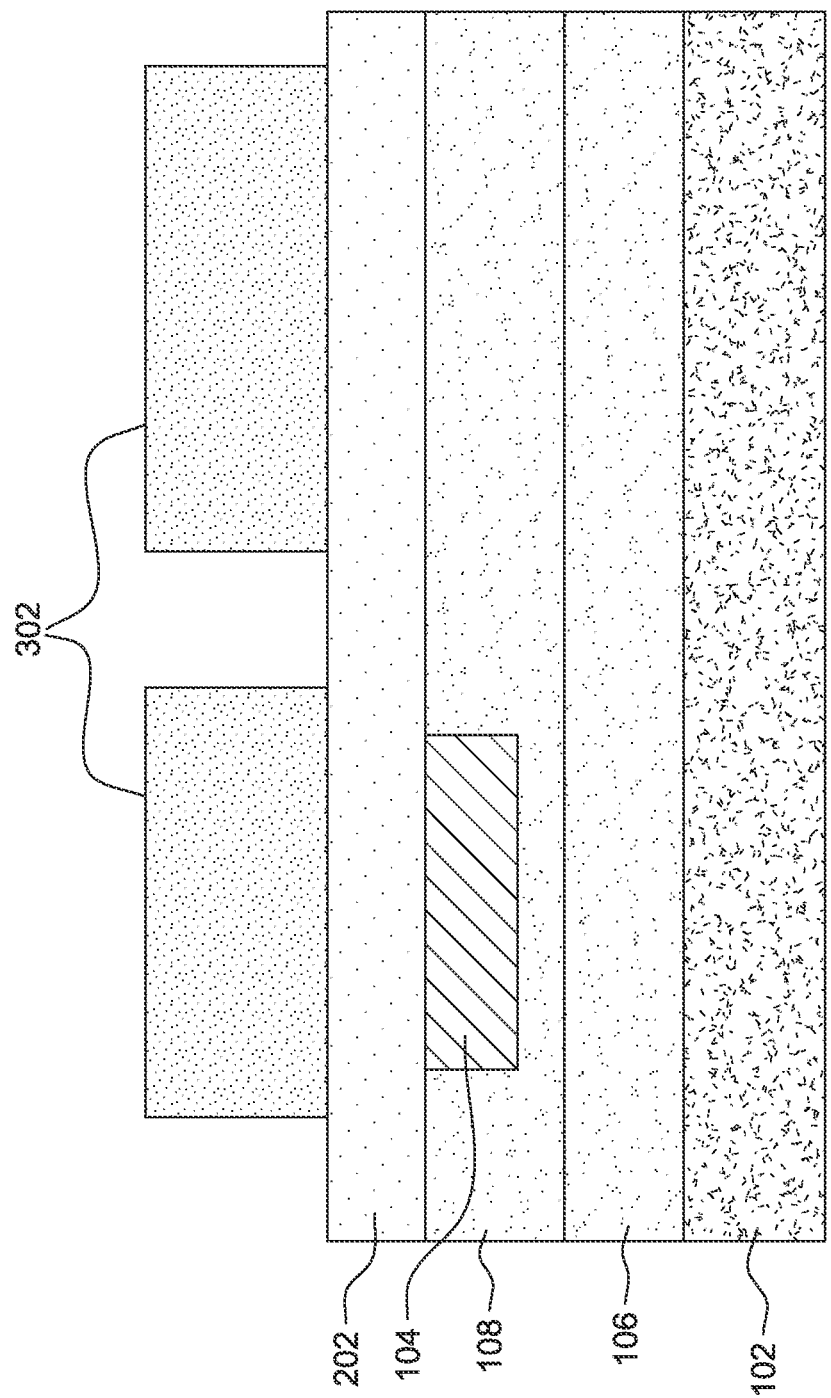
FIG. 3 depicts the use of photolithography to etch away from the first silicon layer, in accordance with an embodiment of the invention.

FIG. 3 depicts the use of photolithography to etch away from silicon layer 202, in accordance with the exemplary embodiment of the invention. In the exemplary embodiment, a layer of photoresist is deposited atop silicon layer 202. A photomask is then placed atop the layer of photoresist and ultraviolet light is used to remove the undesired portions of photoresist, leaving photoresist 302. Plasma is then applied to the wafer. The plasma reacts with the silicon that is not protected/covered by photoresist 302 and results in the un-protected portions of silicon layer 202 being etched away. Plasma refers to a substance which is in a state of matter where a certain portion of its particles are ionized. Plasma may be composed of a variety of substances, depending on the material to be etched away. For example, for silicon, sulfur hexafluoride is often used in plasma etching.

Figure 4:
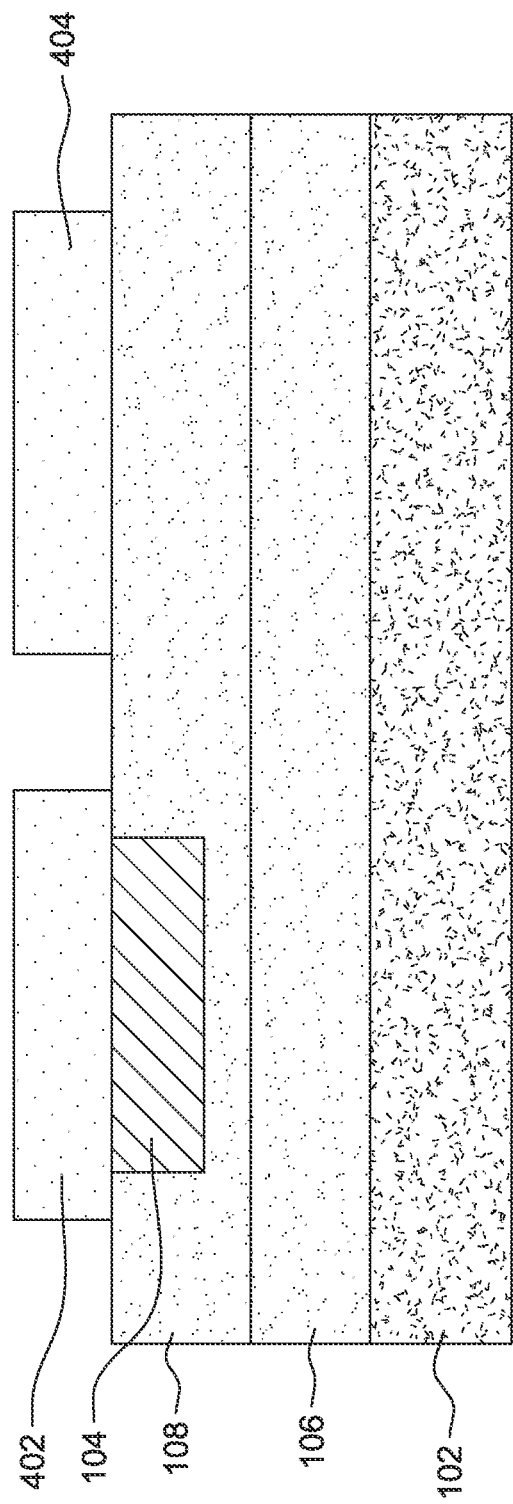
FIG. 4 depicts a lower silicon sacrificial film for the MEMS device and the silicon film for the MOS device formed via photolithography, in accordance with an embodiment of the invention.

FIG. 4 depicts the semiconductor wafer after portions of silicon layer 202 have been etched away, in accordance with the exemplary embodiment of the invention. In the exemplary embodiment, portions of silicon layer 202 are etched away leaving lower silicon sacrificial film 402 and silicon film 404. Lower silicon sacrificial film 402 is a component of the MEMS device while silicon film 404 is a component of a MOS device.

Figure 5:
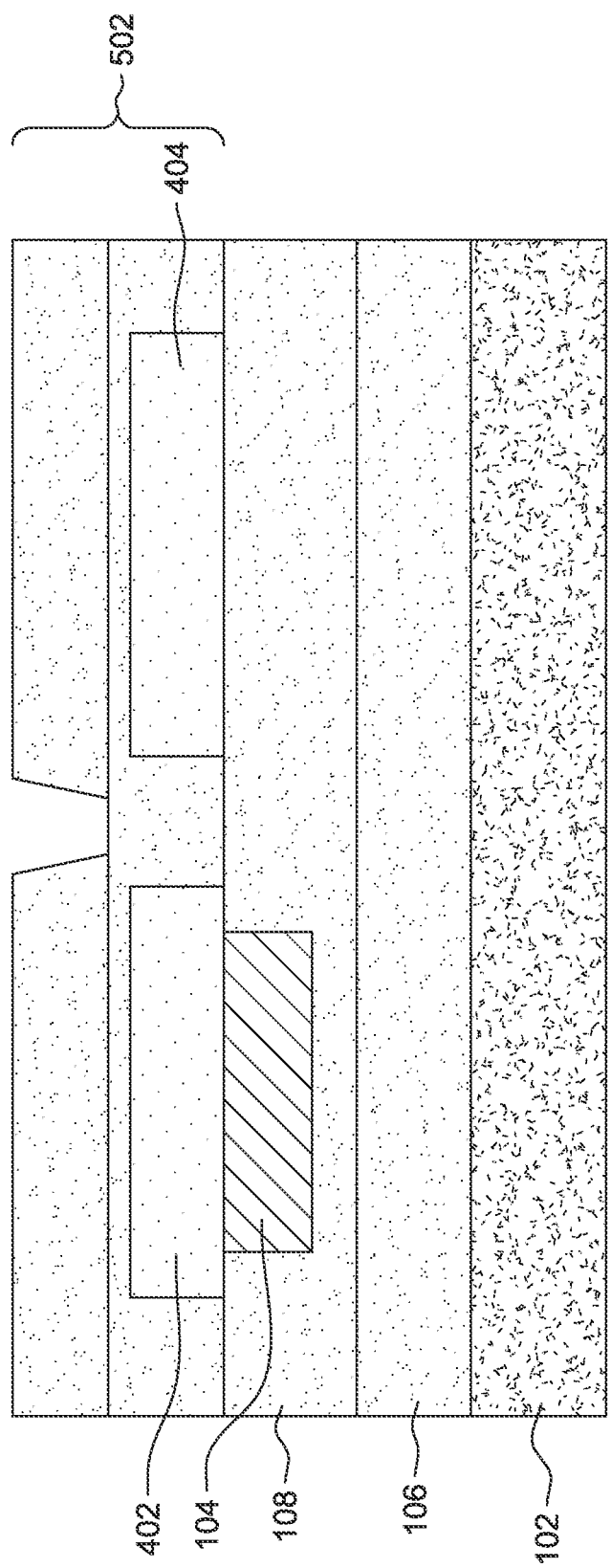
FIG. 5 depicts a first layer of an interlayer dielectric being deposited atop and around the lower silicon sacrificial film of the MEMS device and silicon film of the MOS device, in accordance with an embodiment of the invention.

FIG. 5 depicts interlayer dielectric 502 being deposited atop and around lower silicon sacrificial film 402 and silicon film 404, in accordance with the exemplary embodiment of the invention. In the exemplary embodiment, interlayer dielectric 502 is composed of silicon dioxide. In other embodiments, interlayer dielectric 502 may be composed of another dielectric compounds.

Figure 6:
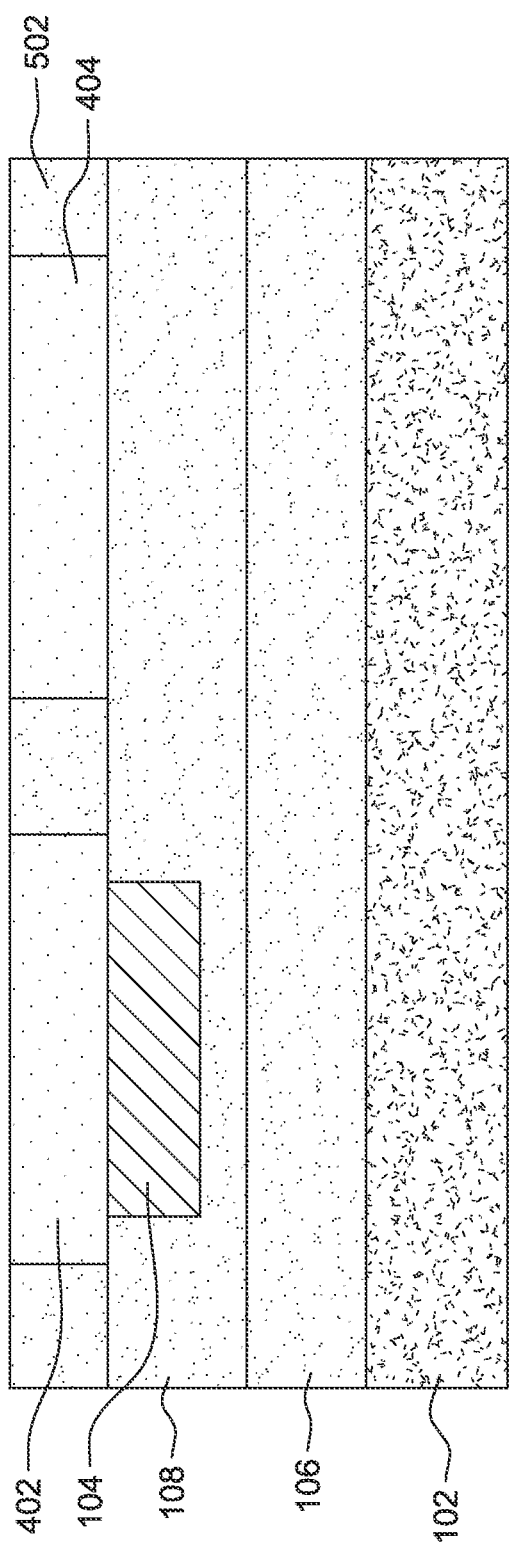
FIG. 6 depicts planarization and the chemical-mechanical polishing of the deposited first layer of interlayer dielectric, in accordance with an embodiment of the invention.

FIG. 6 depicts the chemical-mechanical polishing/planarization of interlayer dielectric 502, in accordance with the exemplary embodiment of the invention. In the exemplary embodiment, the process of chemical-mechanical polishing/planarization smoothes out and polishes interlayer dielectric 502 using a combination of chemical etching and a polishing pad. This process levels the surface of the wafer so that subsequent levels may be added on top if so desired. This process is typically repeated with each layer of the wafer.

Figure 7:
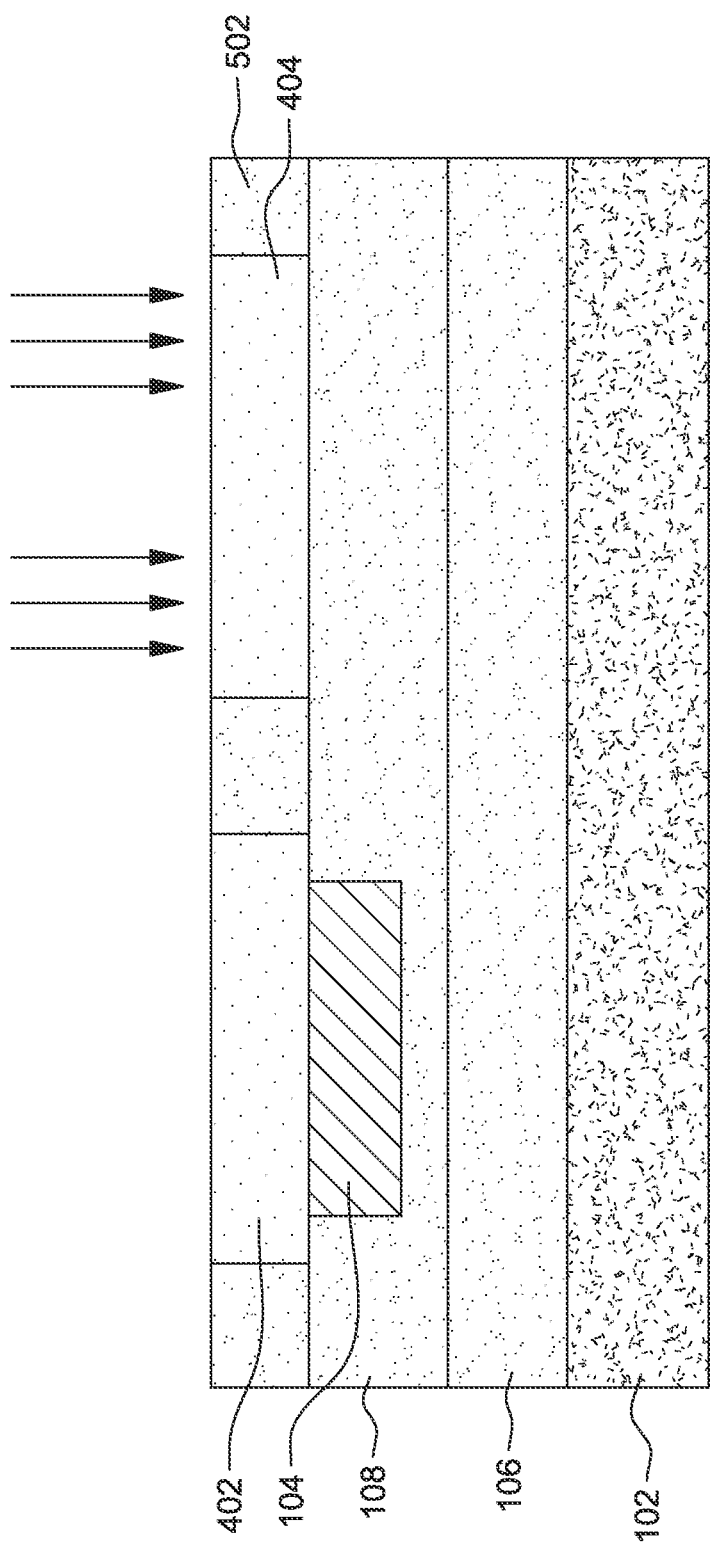
FIG. 7 depicts the forming of the source and drain regions in the silicon film for the MOS device, in accordance with an embodiment of the invention.

FIG. 7 depicts the formation of source and drain regions in silicon film 404, in accordance with the exemplary embodiment of the invention. In the exemplary embodiment, the left and right portions of silicon film 404 are doped via ion implantation to create a source and a drain region in silicon film 404. The source and drain regions can be either p-type or n-type, but they must both be of the same type. In the exemplary embodiment, to form p-type source and drain regions in silicon film 404, the source and drain regions are doped with boron. In the exemplary embodiment, to form n-type source and drain regions in silicon film 404, the source and drain regions are doped with phosphorus.

Figure 8:
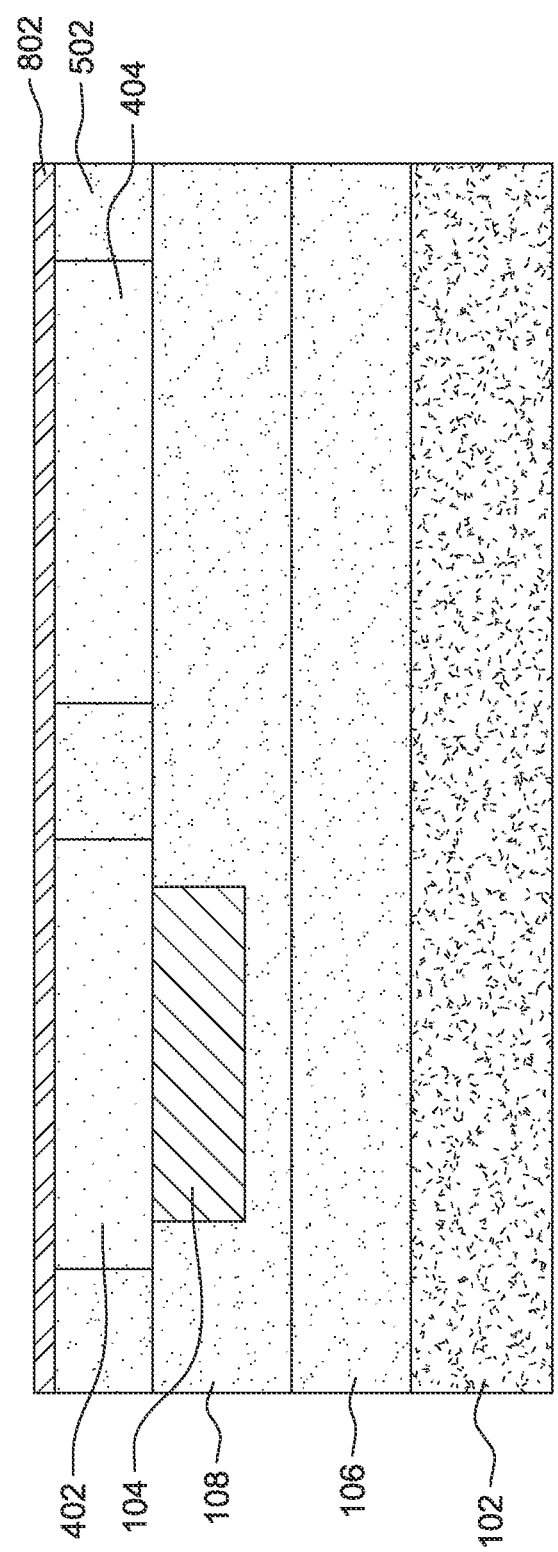
FIG. 8 depicts a gate oxide layer deposited atop the first layer of interlayer dielectric, in accordance with an embodiment of the invention.

FIG. 8 depicts gate oxide layer 802 deposited atop interlayer dielectric 502, in accordance with the exemplary embodiment of the invention. In the exemplary embodiment, gate oxide layer 802 is composed of silicon dioxide, however, in other embodiments, gate oxide layer 802 may be composed of another oxide dielectric compound.

Figure 9:
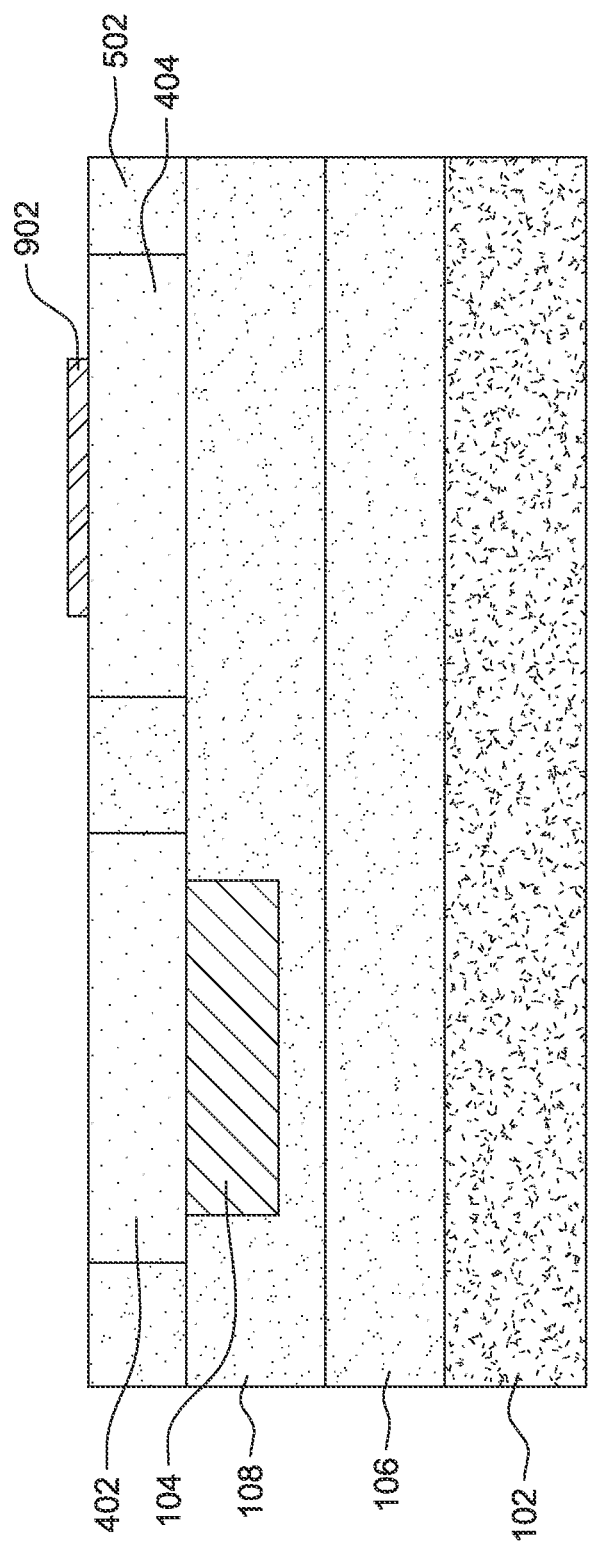
FIG. 9 depicts a gate oxide film, formed from the gate oxide layer, atop the silicon film for the MOS device, in accordance with an embodiment of the invention.

FIG. 9 depicts the formation of gate oxide film 902 atop silicon film 404, in accordance with the exemplary embodiment of the invention. In the exemplary embodiment, gate oxide film 902 is formed from gate oxide layer 802 via photolithography in a similar manner as described above. First, a photoresistant is deposited atop gate oxide layer 802 and a photomask coupled with ultraviolet light is used to remove the undesired portions of the photoresistant. Plasma is then applied to etch away the portion of gate oxide layer 802, which is not protected by the photoresistant, to form gate oxide film 902. In the exemplary embodiment, gate oxide film 902 covers only the portion of silicon film 404 which has not been doped. In other embodiments, photolithography is not used to form gate oxide film 902, with gate oxide layer 802 remaining completely in tact atop interlayer dielectric 502.

Figure 10:
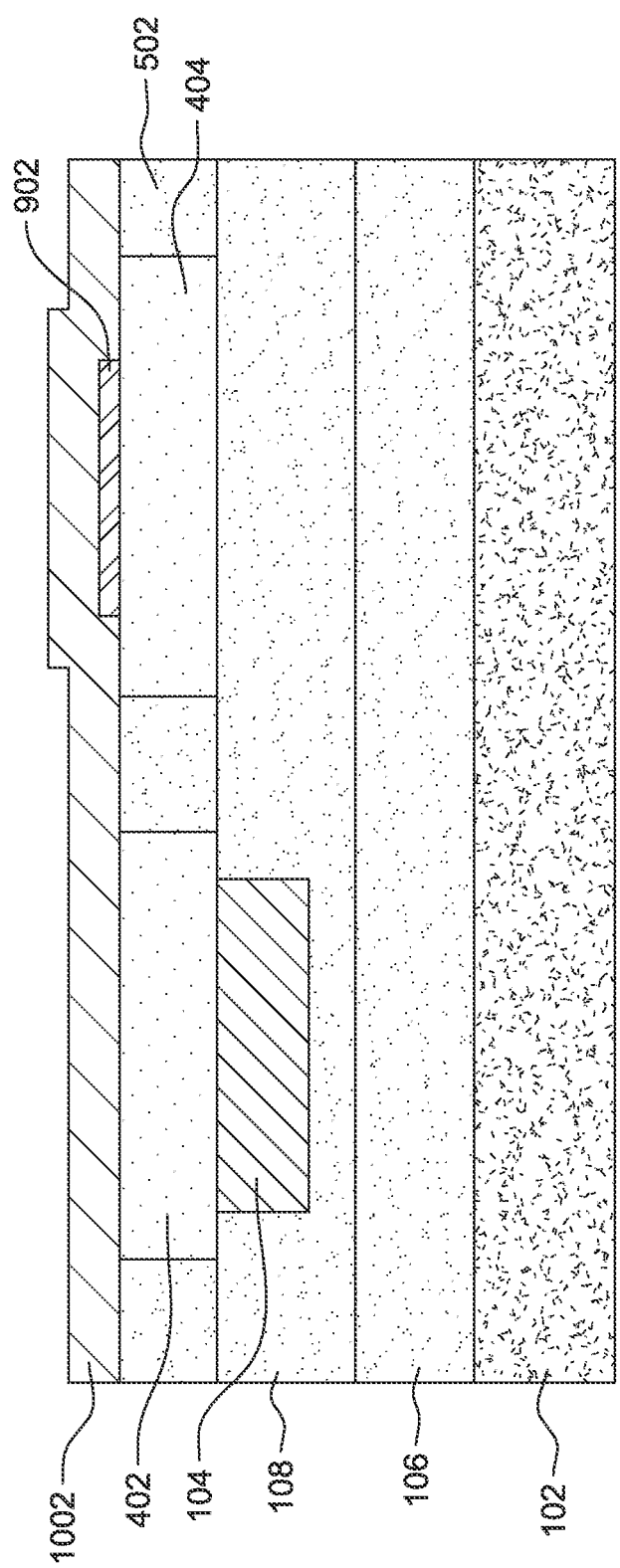
FIG. 10 depicts a first layer of metal being deposited atop and around the gate oxide film and the first layer of interlayer dielectric, in accordance with an embodiment of the invention.

FIG. 10 depicts metal layer 1002 deposited atop interlayer dielectric 502 and gate oxide film 902, in accordance with the exemplary embodiment of the invention. In the exemplary embodiment, metal layer 1002 is composed of tungsten. In other embodiments, metal layer 1002 may be composed of other metals, such as aluminum, titanium nitride or tantalum.

Figure 11A:
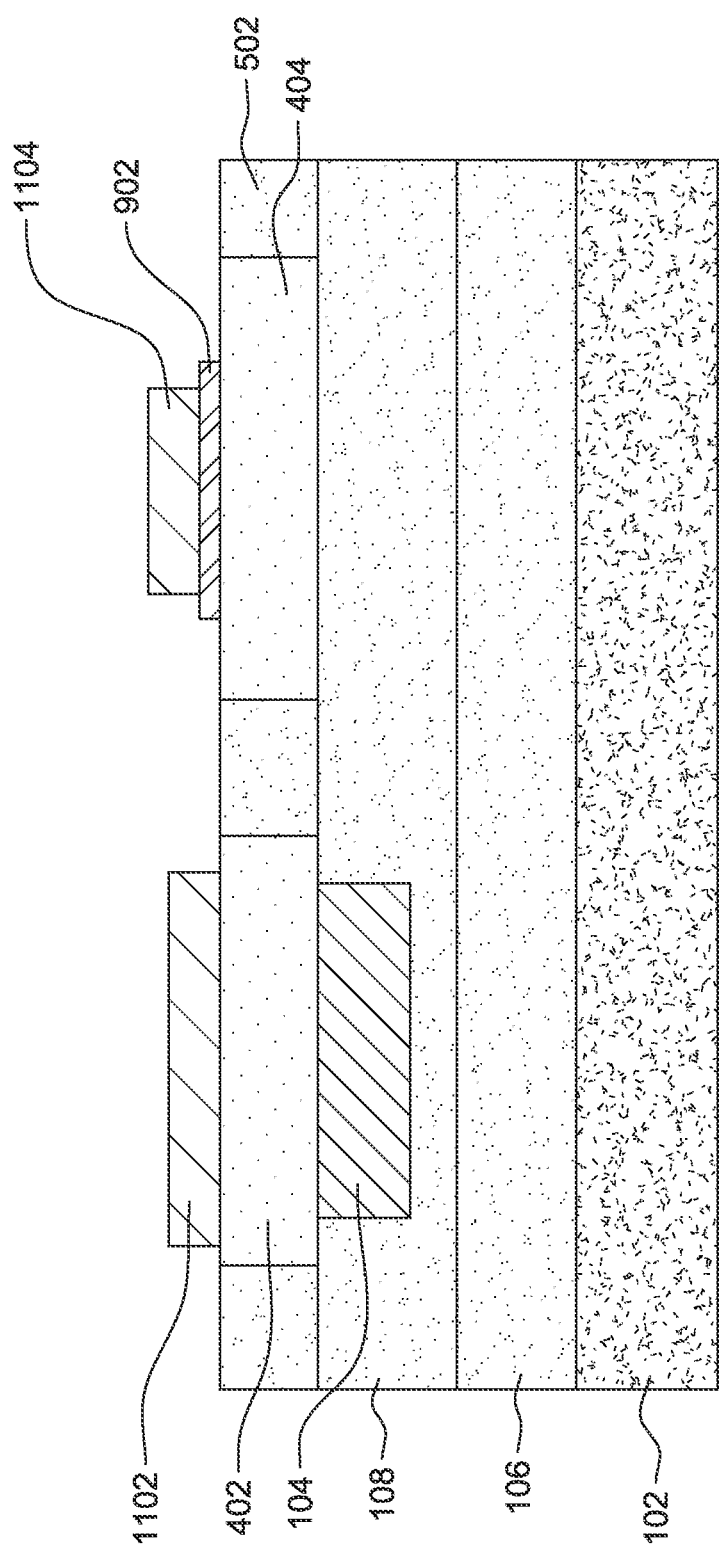
FIG. 11a depicts a metal gate for the MOS device and a first upper electrode for the MEMS device formed from the deposited first layer of metal, in accordance with an embodiment of the invention.

FIG. 11a depicts the formation of first upper electrode 1102 and metal gate 1104, in accordance with the exemplary embodiment of the invention. In the exemplary embodiment, first upper electrode 1102 and metal gate 1104 are formed from metal layer 1002 via photolithography in a similar manner as described above.

Figure 11B:
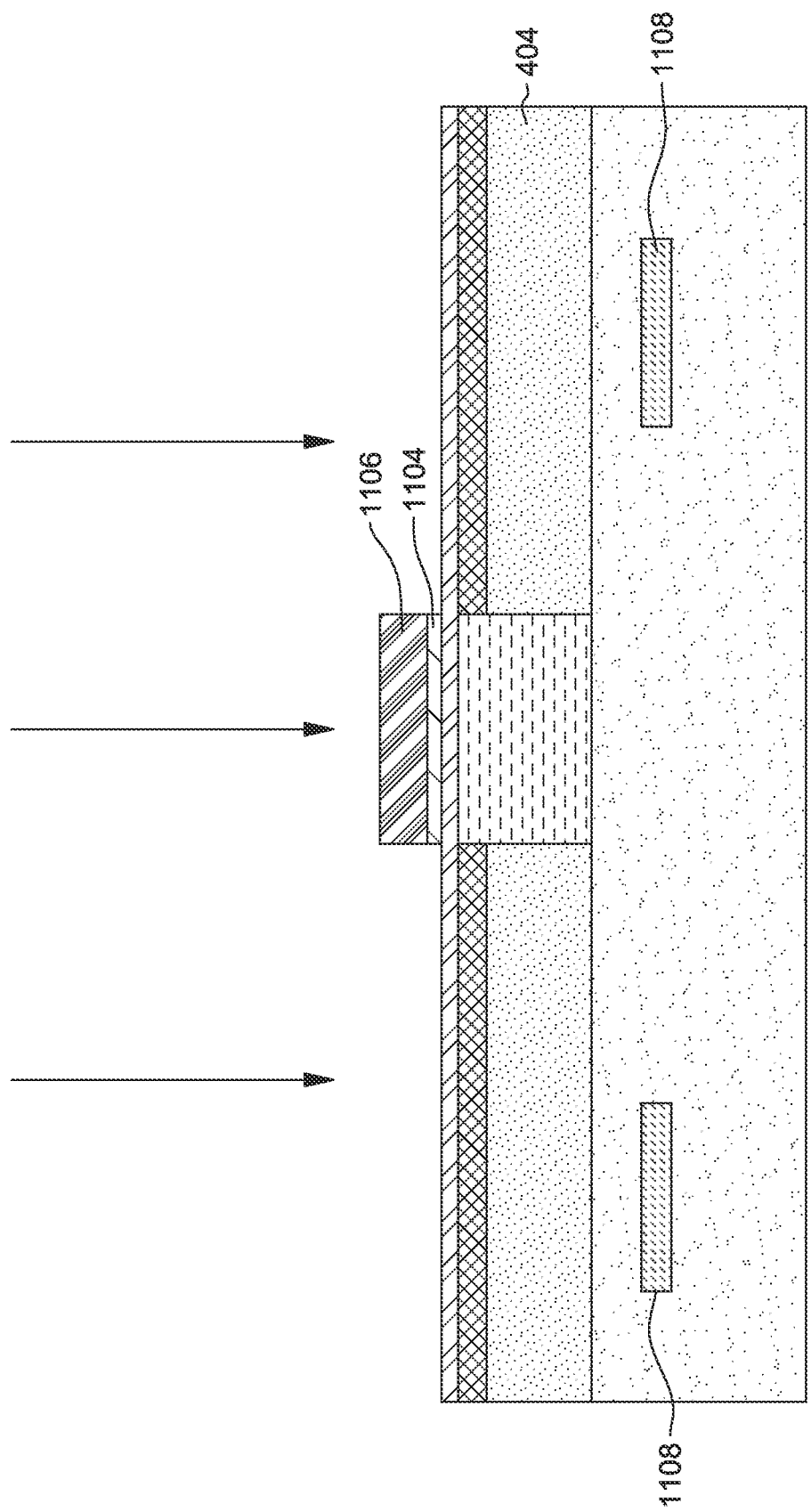
FIG. 11b depicts the use of laser annealing to activate the dopants in the source and drain regions of the silicon film for the MOS device, in accordance with an exemplary embodiment of the invention.

FIG. 11b depicts the use of laser annealing in activating the dopants in the source and drain regions of silicon film 404, in accordance with the exemplary embodiment of the invention. In the exemplary embodiment, after ion implantation, the dopants are activated by applying thermal energy to the source and drain regions (doped regions) in silicon 404 by way of laser annealing. Metal reflectors 1108 implanted in the underlying dielectric layers, discussed above with regard to FIG. 1, block the edges of silicon film 404 by absorbing or reflecting the thermal energy that escapes the doped regions of silicon film 404. Metal gate 1104 stops the thermal energy from penetrating into the un-doped portion of silicon film 404. Optionally, oxide hardmask 1106 may also be deposited atop metal gate 1104 to offer extra protection for the un-doped portion of silicon film 404.

Figure 12:
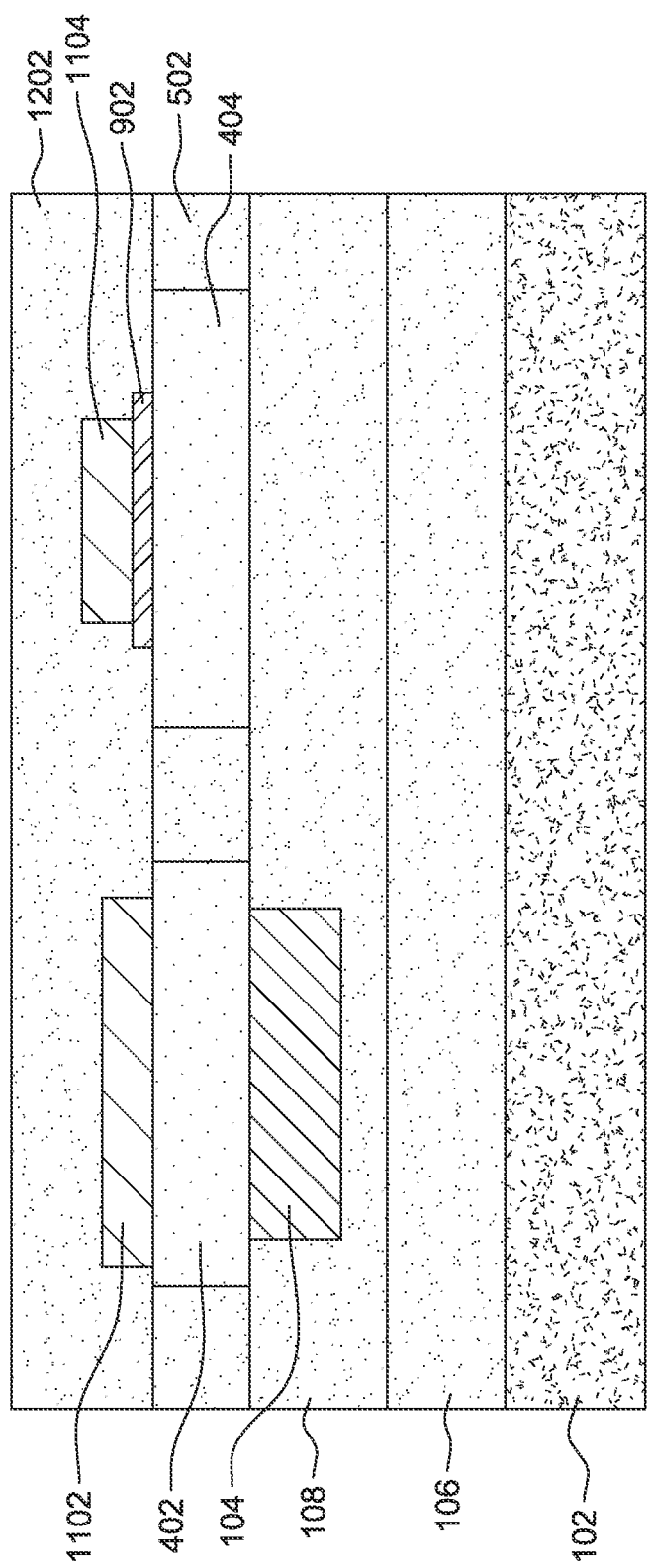
FIG. 12 depicts a second layer of interlayer dielectric deposited atop and around the metal gate and the gate oxide film of the MOS device, and the first upper electrode of the MEMS device, in accordance with an embodiment of the invention.

FIG. 12 depicts the deposition of interlayer dielectric 1202 atop and around first upper electrode 1102 and metal gate 1104, in accordance with the exemplary embodiment of the invention. In the exemplary embodiment, interlayer dielectric 1202 is composed of silicon dioxide. In other embodiments, interlayer dielectric 1202 may be composed of another dielectric compound. After deposition, interlayer dielectric 1202 is smoothed out and polished via the process of chemical-mechanical polishing/planarization described above.

Figure 13:
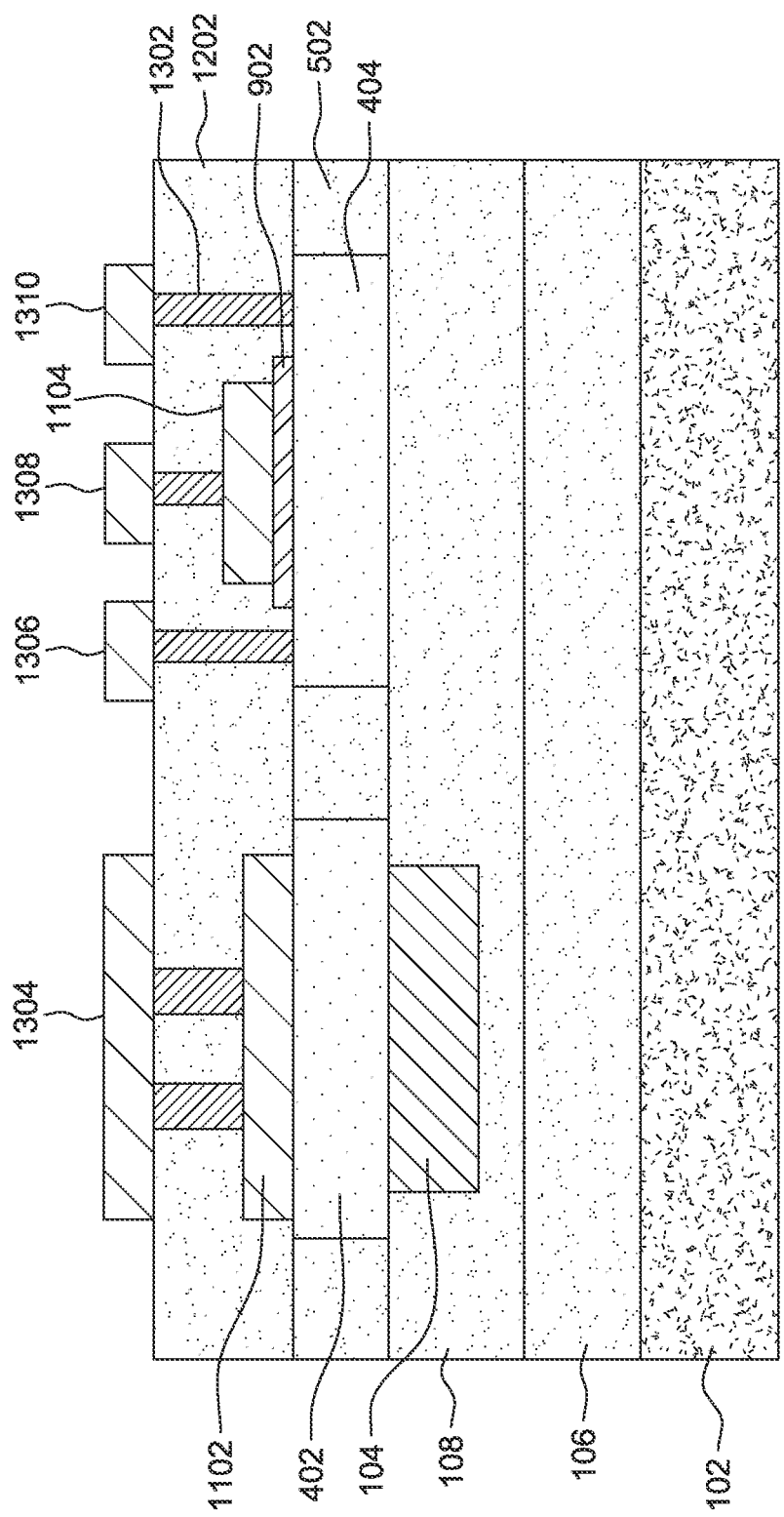
FIG. 13 depicts a second upper electrode for the MEMS device and three metal electrodes for the MOS device, formed from a second layer of metal deposited atop the second layer of interlayer dielectric, in accordance with an embodiment of the invention.

FIG. 13 depicts the formation of second upper electrode 1304, metal electrode 1306, metal electrode 1308, and metal electrode 1310 from a second metal layer, not shown, which is deposited atop interlayer dielectric 1202, and also the formation of vias 1302, in accordance with the exemplary embodiment of the invention. In the exemplary embodiment, vias 1302 are formed by way of photolithography in a similar manner as described above. Once vias 1302 have been formed, they are filled with an electrically conductive material, such as tungsten, aluminum, copper or gold. In the exemplary embodiment, second upper electrode 1304, metal electrode 1306, metal electrode 1308 and metal electrode 1310 are then formed via photolithography, in a similar manner as described above, from the second metal layer, which is deposited atop vias 1302 and interlayer dielectric 1202. In the exemplary embodiment, second upper electrode 1304, metal electrode 1306, metal electrode 1308 and metal electrode 1310 are composed of tungsten, however, in other embodiments, second upper electrode 1304, metal electrode 1306, metal electrode 1308, and metal electrode 1310 may be composed of other metals such as aluminum, titanium nitride or tantalum. In the exemplary embodiment, vias 1302 connect second upper electrode 1304 to first upper electrode 1102, metal electrode 1306 to the drain region of silicon film 404, metal electrode 1308 to metal gate 1104 and metal electrode 1310 to the source region of silicon film 404.

Figure 14:
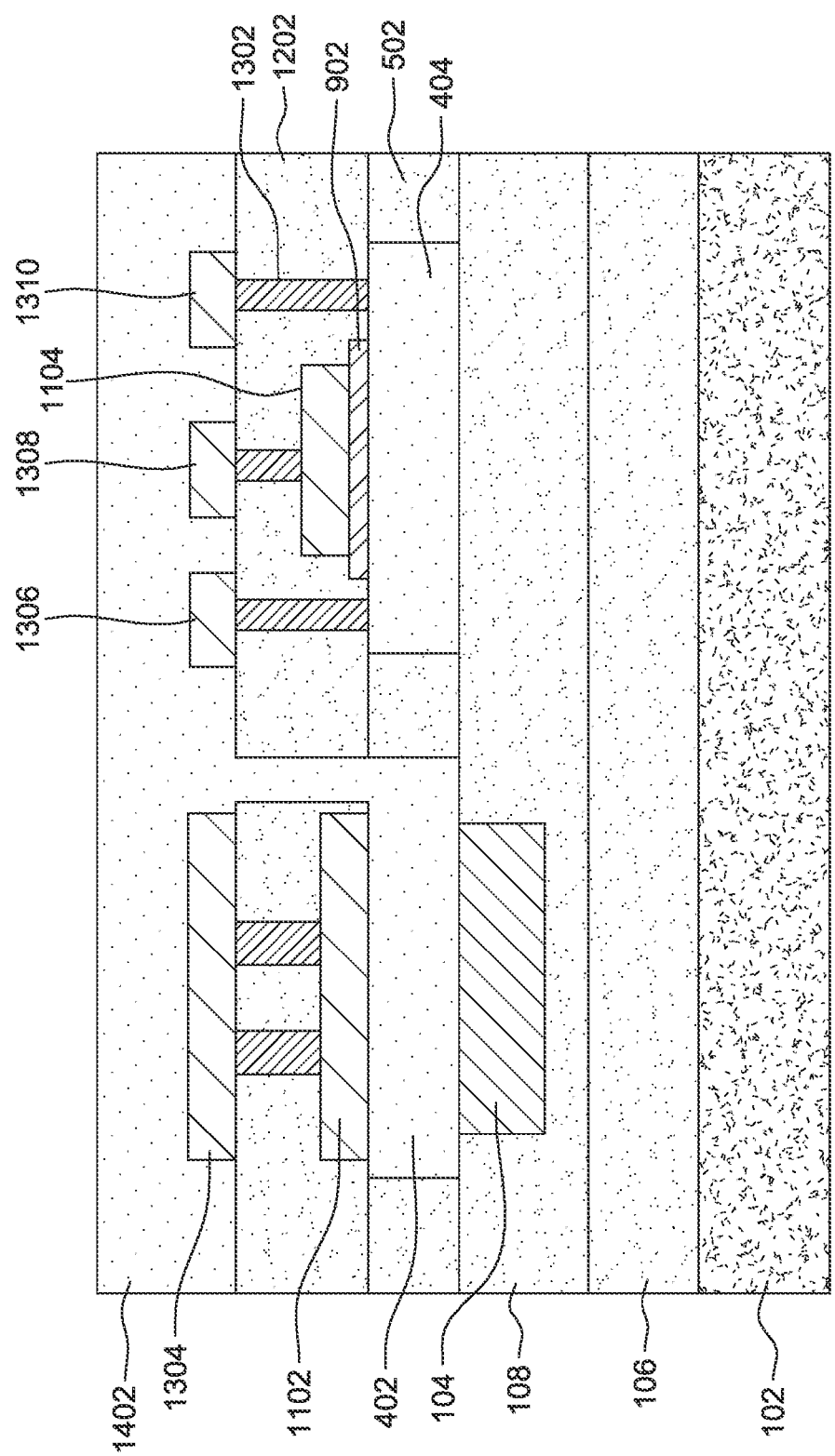
FIG. 14 depicts a second silicon layer deposited atop and around the second upper electrode for the MEMS device and the three metal electrodes of the MOS device, in accordance with an embodiment of the invention.

FIG. 14 depicts the deposition of silicon layer 1402 atop and around second upper electrode 1304, metal electrode 1306, metal electrode 1308 and metal electrode 1310. In the exemplary embodiment, silicon layer 1402 is deposited via chemical vapor deposition or physical vapor deposition. As depicted, before silicon layer 1402 is deposited, a portion of interlayer dielectric 1202 is etched away down to lower silicon sacrificial film 402 via photolithography. The portion of interlayer dielectric 1202 that is etched away serves as a tunnel down to lower silicon sacrificial film 402. Therefore, in the exemplary embodiment, the portion of interlayer dielectric 1202 that is etched away doesn't fully extend horizontally through the semiconductor device, but just serves as a means of connecting an upper layer of silicon to lower silicon sacrificial film 402. Silicon layer 1402 is then deposited atop and around second upper electrode 1304, metal electrode 1306, metal electrode 1308, and metal electrode 1310, while also filling in the etched away tunnel of interlayer dielectric 1202, which extends down to lower silicon sacrificial film 402.

Figure 15:
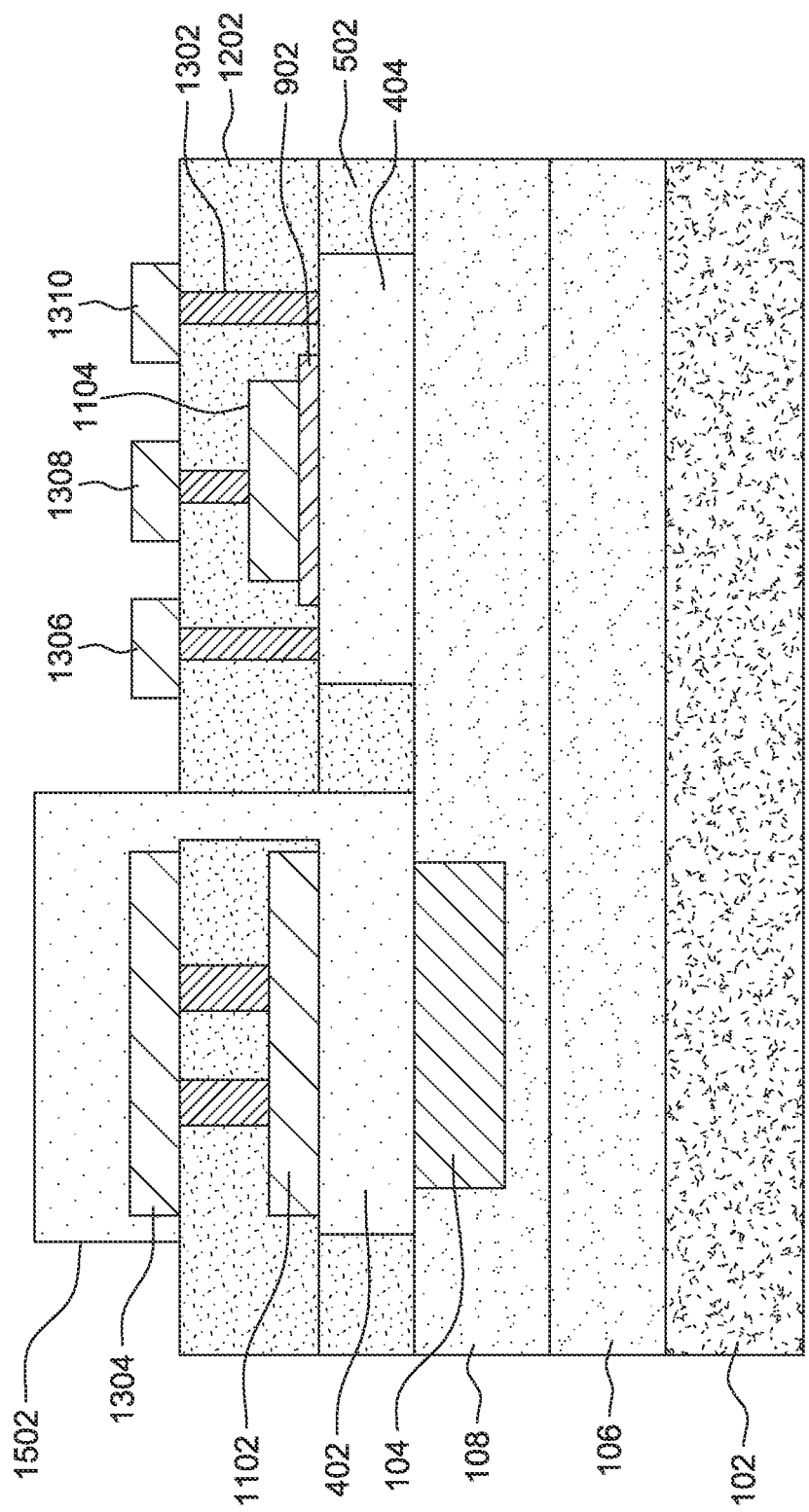
FIG. 15 depicts an upper silicon sacrificial film for the MEMS device formed from second silicon layer, in accordance with an embodiment of the invention.

FIG. 15 depicts the formation of upper silicon sacrificial film 1502 from silicon layer 1402, in accordance with the exemplary embodiment of the invention. In the exemplary embodiment, upper silicon sacrificial film 1502 is formed from silicon layer 1402 via photolithography in a similar manner as described above.

Figure 16:
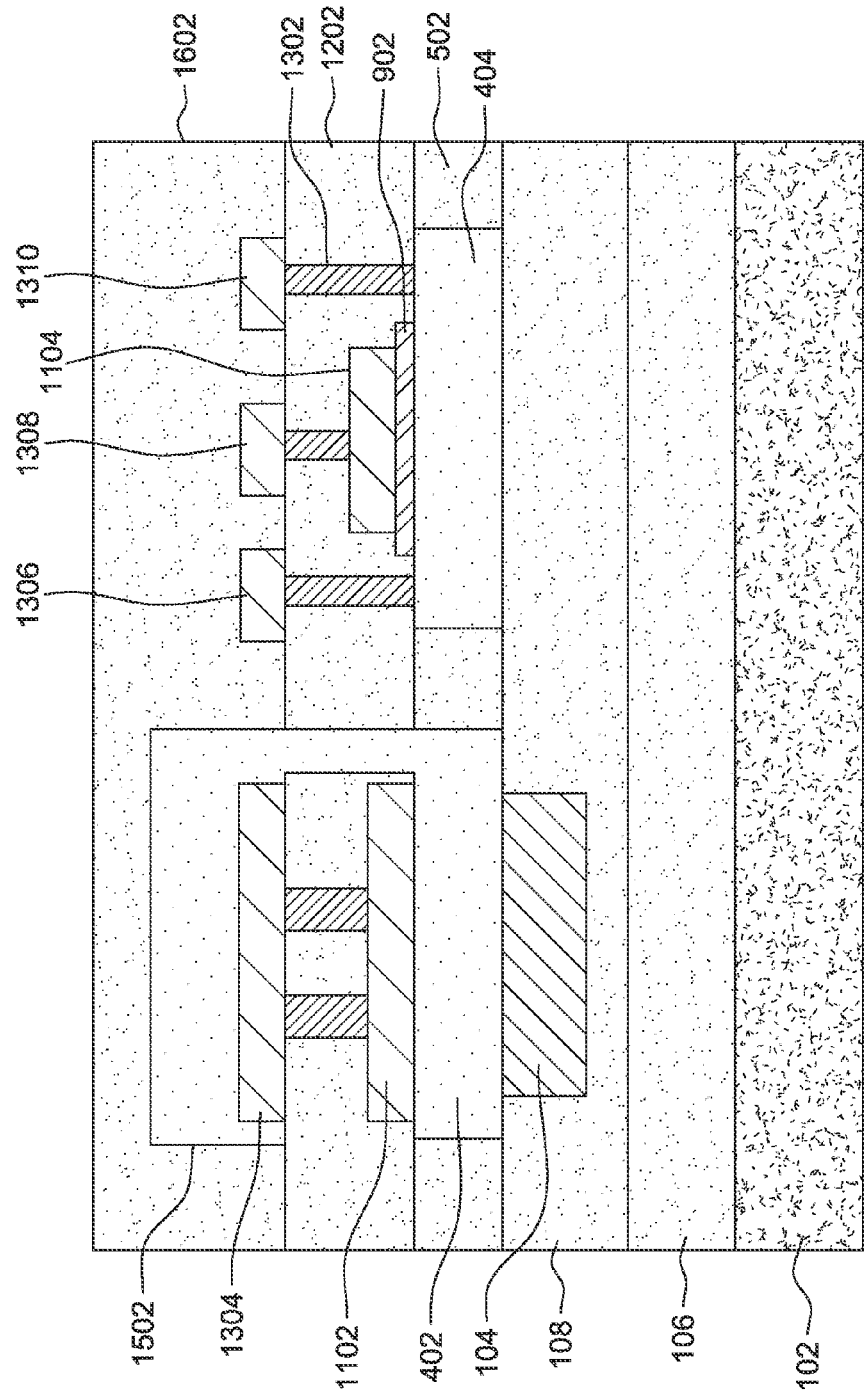
FIG. 16 depicts a third layer of interlayer dielectric deposited atop and around the upper silicon sacrificial film of the MEMS device and the three metal electrodes of the MOS device, with the upper and lower silicon sacrificial film being subsequently removed via chemical etching, in accordance with an embodiment of the invention.

FIG. 16 depicts the deposition of interlayer dielectric 1602 atop and around upper silicon sacrificial film 1502, metal electrode 1306, metal electrode 1308 and metal electrode 1310, in accordance with the exemplary embodiment of the invention. In the exemplary embodiment, interlayer dielectric 1602 is composed of silicon dioxide. In other embodiments, interlayer dielectric 1602 may be composed of another dielectric compound. After deposition, interlayer dielectric 1602 is smoothed out and polished via the process of chemical-mechanical polishing/planarization described above.

Figure 17:
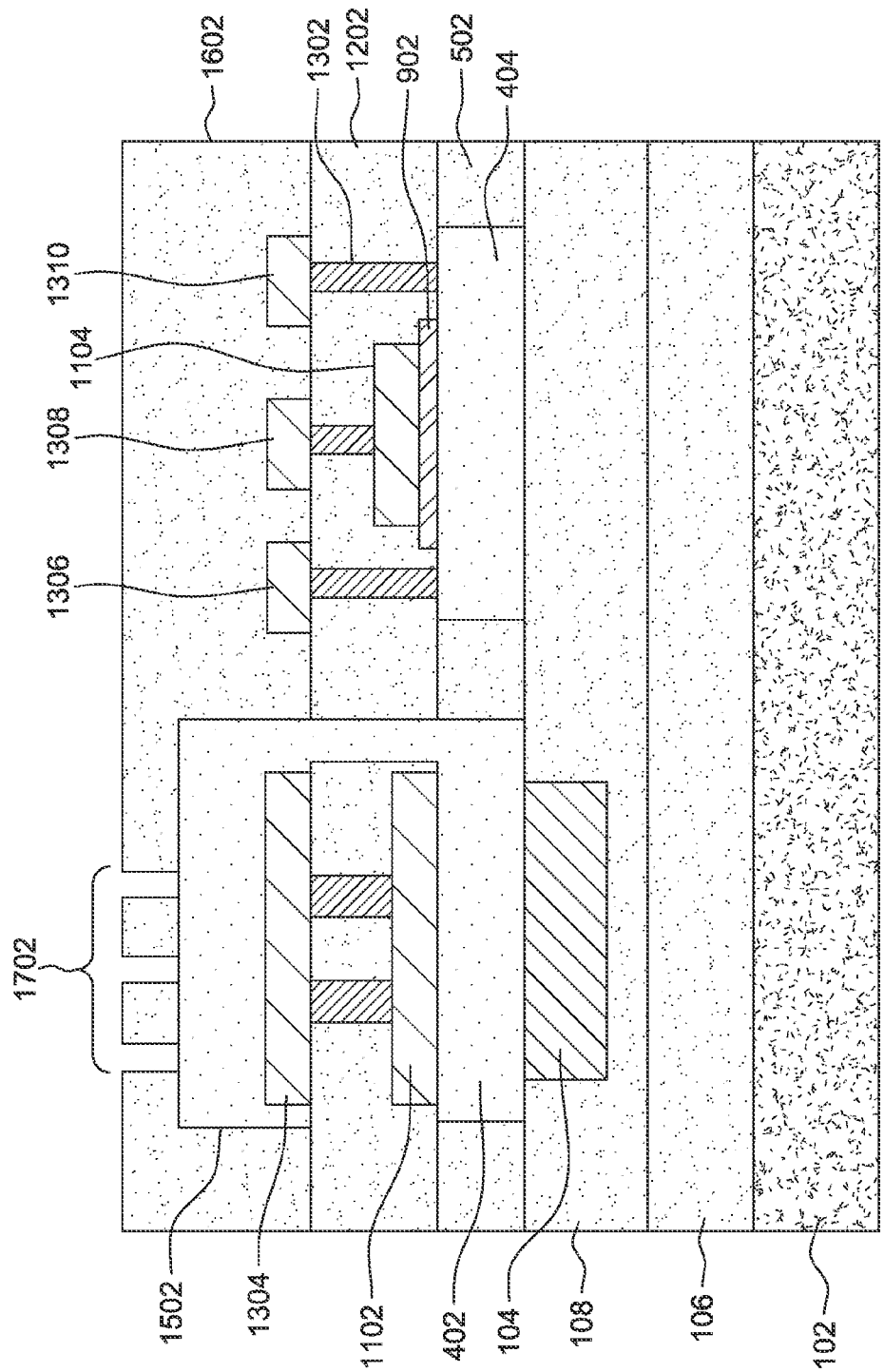
FIG. 17 depicts the formation of venting holes through the third layer of interlayer dielectric down to the upper silicon sacrificial film, in accordance with an embodiment of the invention.

FIG. 17 depicts the formation of venting holes 1702 through interlayer dielectric 1602, in accordance with the exemplary embodiment of the invention. In the exemplary embodiment, venting holes 1702 are formed via photolithography in a similar manner as described above, and extend down to upper silicon sacrificial film 1502.

Figure 18:
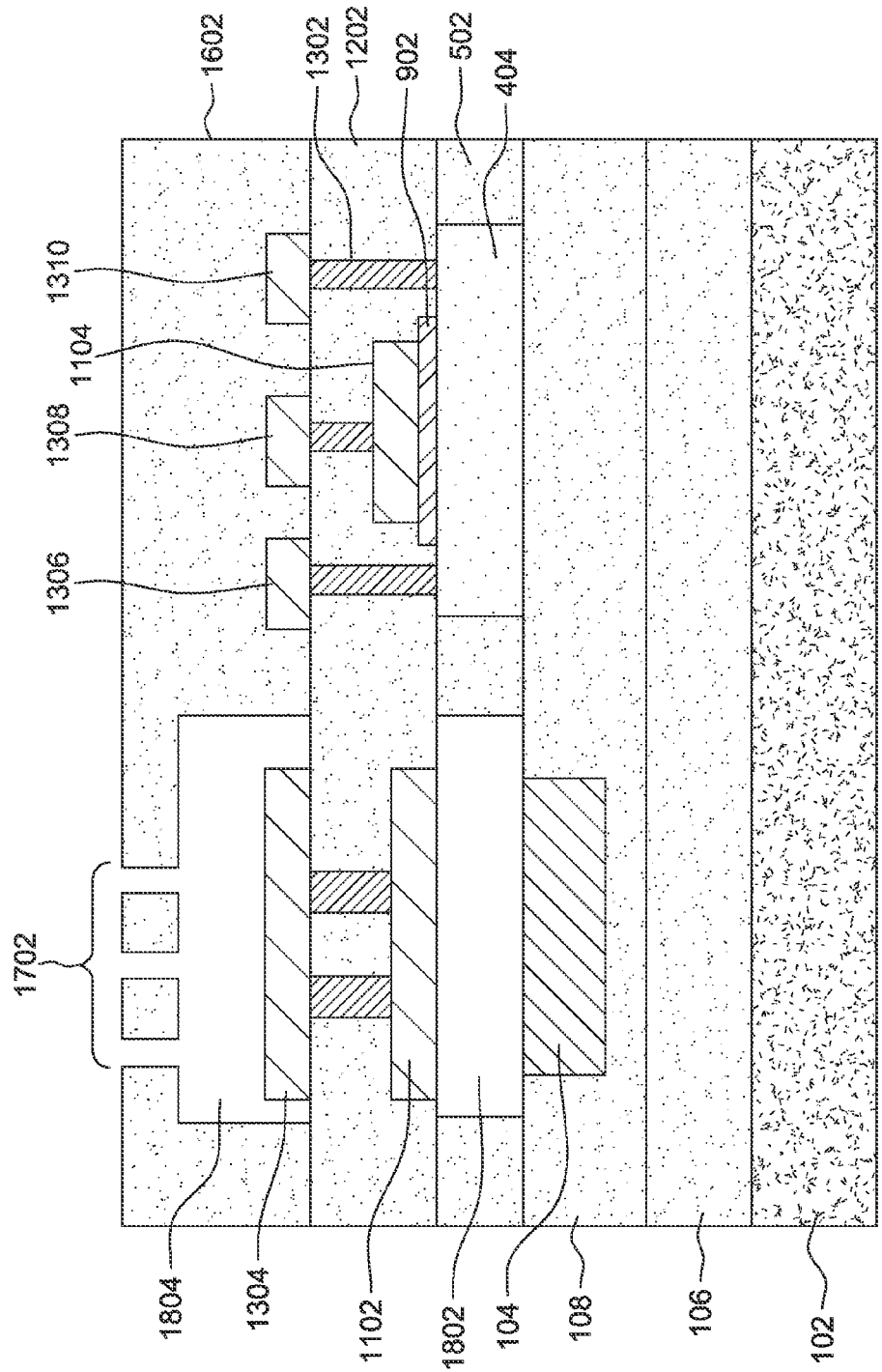
FIG. 18 depicts the upper and lower silicon sacrificial films of the MEMS device vented through the venting holes leaving an upper and lower cavity, in accordance with an embodiment of the invention.

FIG. 18 depicts the venting of upper silicon sacrificial film 1502 and lower silicon sacrificial film 402, in accordance with the exemplary embodiment of the invention. In the exemplary embodiment, the venting process is accomplished by way of chemical etching using xenon diflouride. In other embodiments, other chemical agents may be used. In the exemplary embodiment, xenon diflouride is inserted via venting holes 1702. Interlayer dielectric 1602 and interlayer dielectric 1202 are unaffected because xenon diflouride does not affect dielectrics. Xenon diflouride reacts with upper silicon sacrificial film 1502 and lower silicon sacrificial film 402, to create xenon gas and silicon tetraflouride gas which is then vented out via venting holes 1702, leaving upper cavity 1804 and lower cavity 1802.

Figure 19:
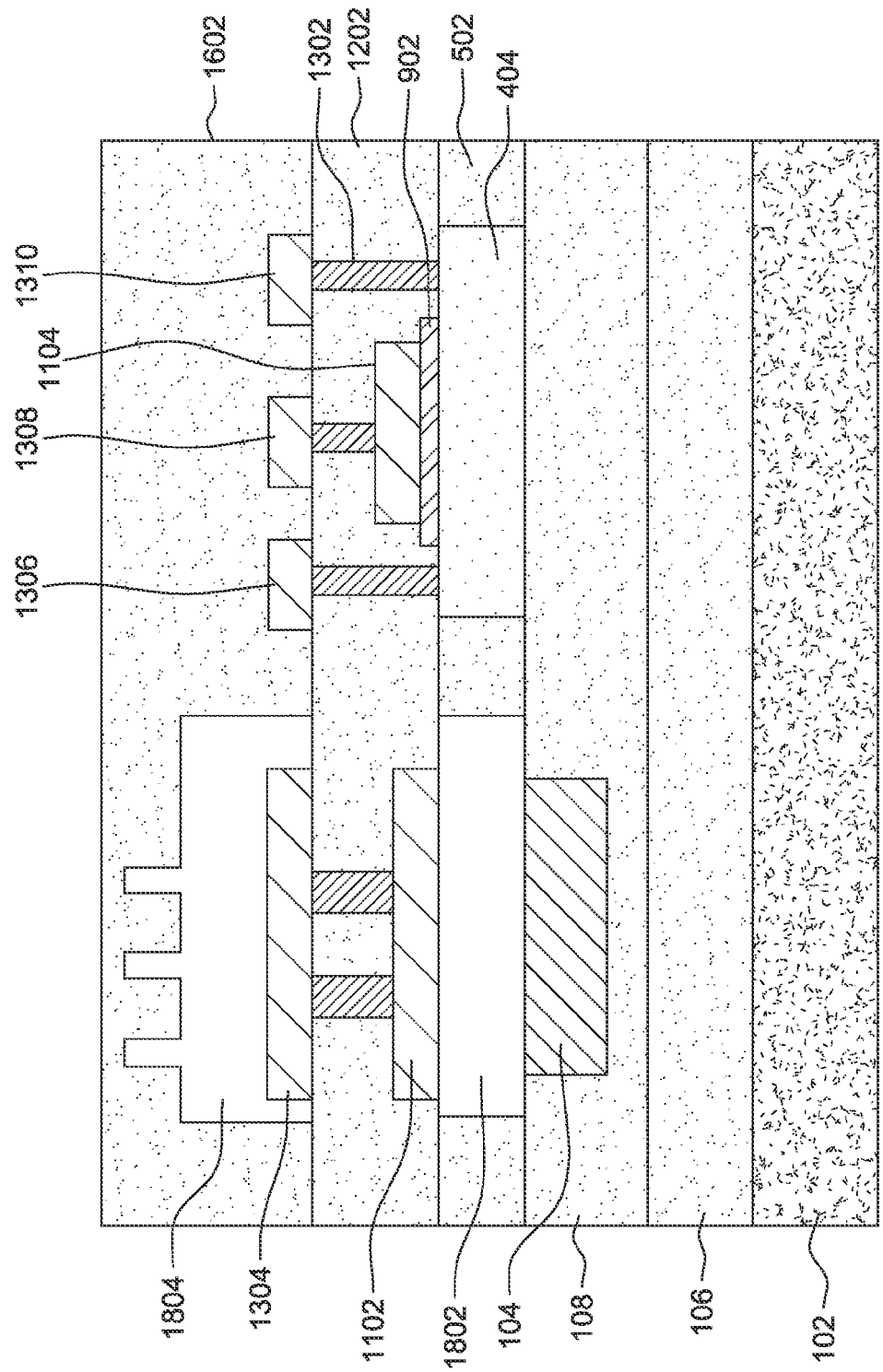
FIG. 19 depicts the venting holes being sealed by the deposition of an interlayer dielectric, in accordance with an embodiment of the invention.
Figure 20:
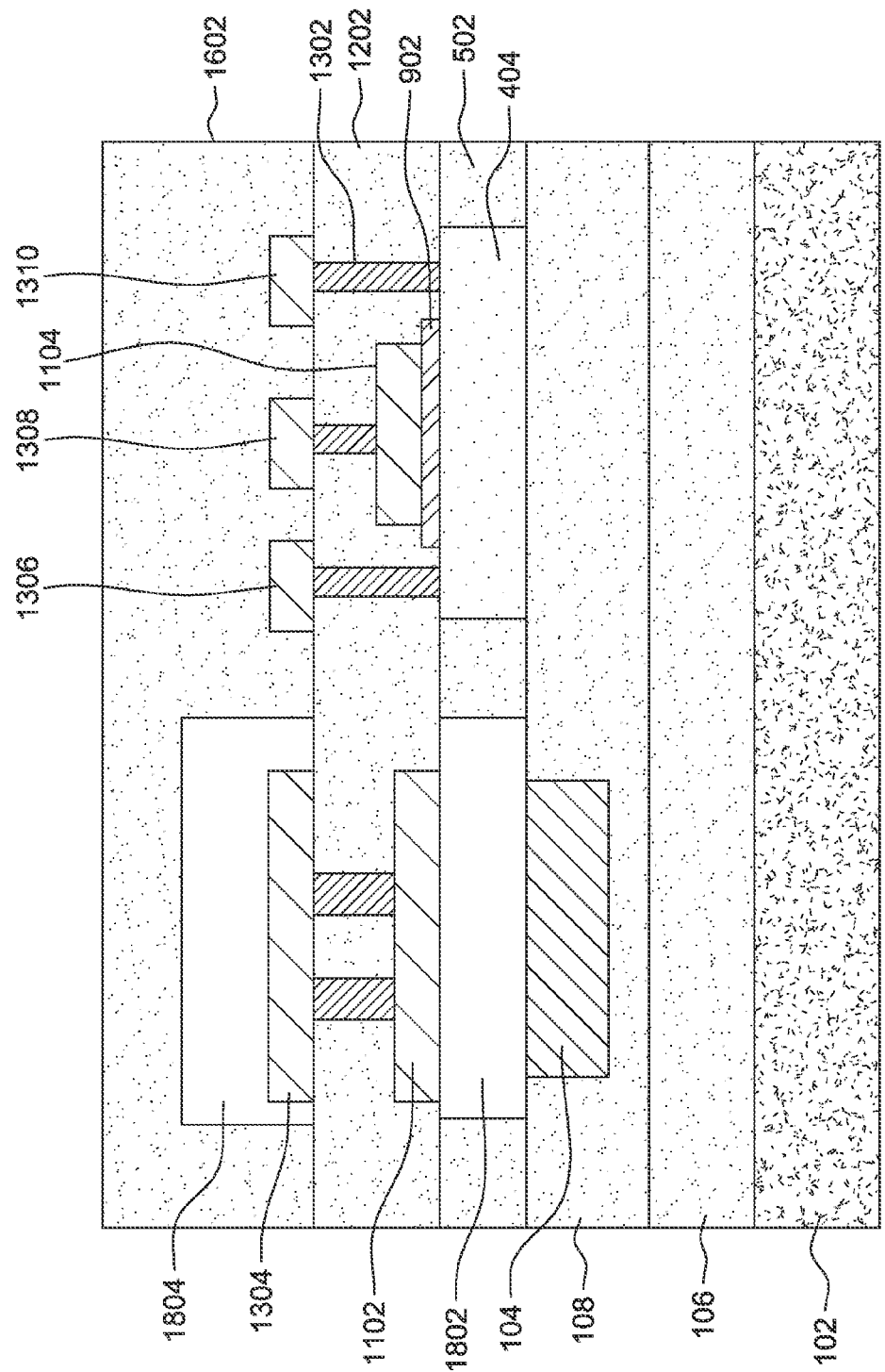
FIG. 20 depicts the venting holes being sealed and filled by the deposition of an interlayer dielectric, in accordance with an embodiment of the invention.

In the exemplary embodiment, an interlayer dielectric is deposited in venting holes 1702, sealing the top of venting holes 1702 as depicted in FIG. 19, or completely filling in venting holes 1702 as depicted in FIG. 20. In the exemplary embodiment, the deposited interlayer dielectric is composed of silicon dioxide. In other embodiments, the deposited interlayer dielectric may be composed of another dielectric compound. After deposition, interlayer dielectric 1602 is once again smoothed out and polished via the process of chemical-mechanical polishing/planarization described above.

Figure 21:
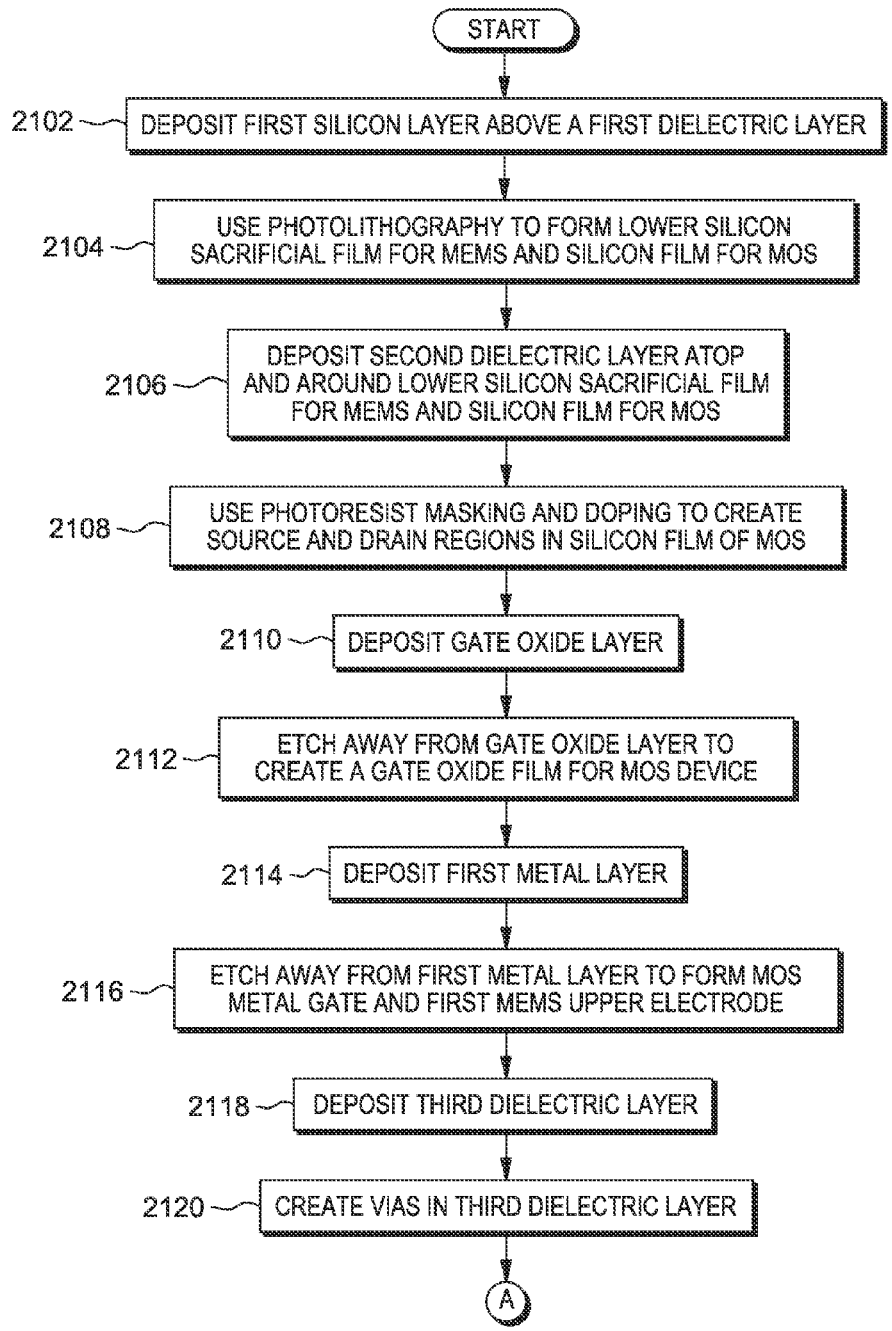
FIGS. 21 and 22 illustrate a flowchart of a process for integrating the fabrication of a MOS and MEMS device into the back end of line process, in accordance with an embodiment of the invention.
Figure 22:
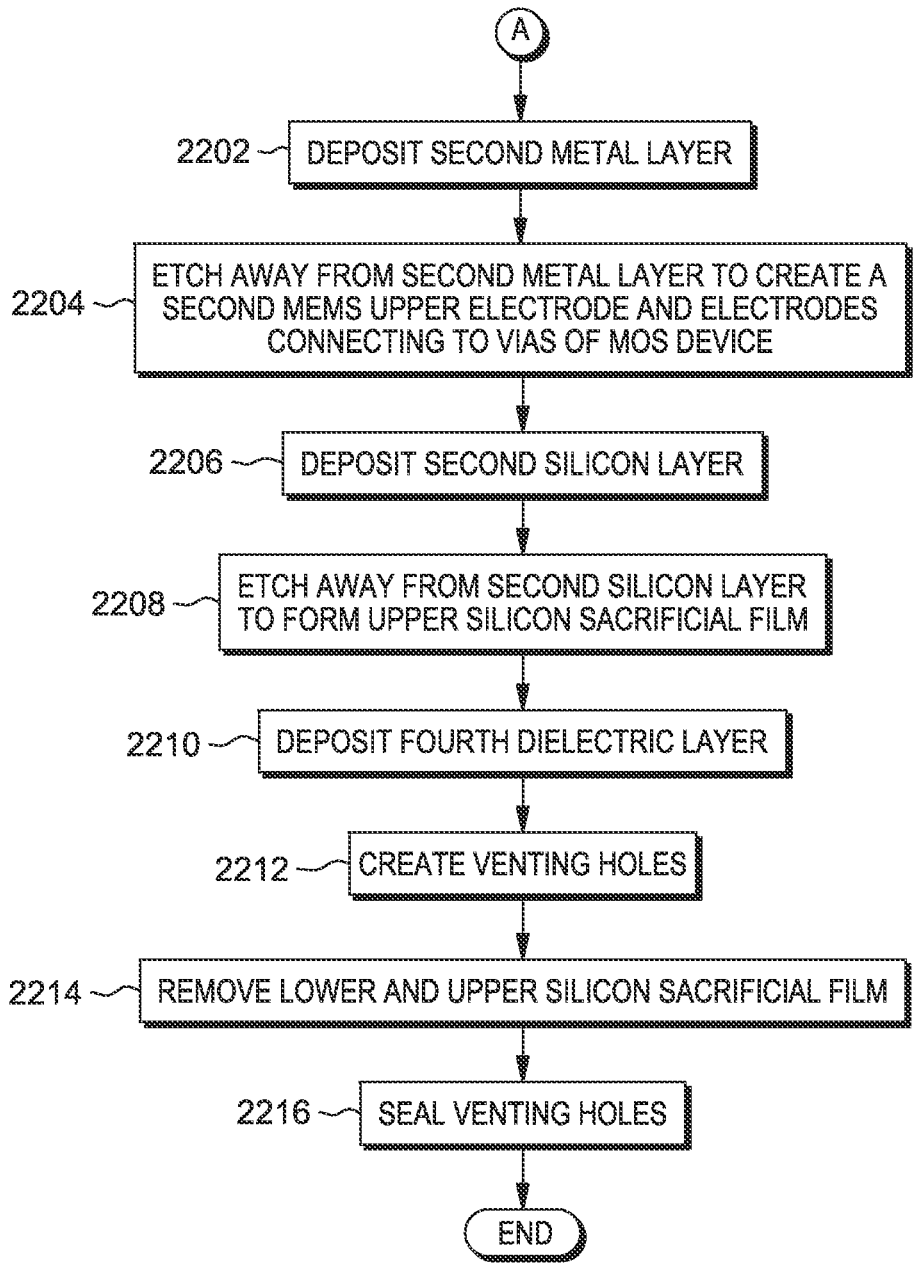

FIGS. 21 and 22 illustrate a flowchart of a process for integrating the fabrication of a MOS and MEMS device into the back end of line process, in accordance with the exemplary embodiment of the invention. The invention begins by a first silicon layer being deposited above a first dielectric layer (step 2102). The process of photolithography is then used to form the lower silicon sacrificial film for the MEMS device and the silicon film for the MOS device (step 2104). A second dielectric layer is then deposited atop and around the lower silicon sacrificial film of the MEMS device and the silicon film of the MOS device (step 2106).

Photoresist masking and doping is then used to create source and drain regions in the silicon film of the MOS device (step 2108). Once the source and drain regions have been created in the silicon film of the MOS device, a gate oxide layer is deposited atop the second dielectric layer (step 2110). Photolithography is then used to etch away from the gate oxide layer to form a gate oxide film for the MOS device (step 2112).

A first metal layer is then deposited atop the gate oxide film and the second dielectric layer (step 2114). Photolithography is then used to etch away from the first metal layer to form a metal gate for the MOS device and a first upper electrode for the MEMS device (step 2116). A third dielectric layer is then deposited atop and around the metal gate of the MOS device and the first upper electrode of the MEMS device (step 2118). Photolithography is then used to etch through desired portions of the third dielectric layer to create vias down to the first upper electrode of the MEMS device, the source and drain regions of the silicon film of the MOS device, and the metal gate of the MOS device (step 2120). In the exemplary embodiment, the vias are filled with electrically conductive material.

A second metal layer is then deposited atop the third dielectric layer (step 2202). Photolithography is then used to etch away from the second metal layer to form a second upper electrode for the MEMS device, a first metal electrode which connects through a via to the drain region of the silicon film of the MOS device, a second metal electrode which connects through a via to the metal gate of the MOS device, and a third metal electrode which connects through a via to the source region of the MOS device (step 2204).

A second silicon layer is then deposited atop and around the second upper electrode, the first metal electrode, the second metal electrode and the third metal electrode (step 2206). In the exemplary embodiment, prior to the deposition of the second silicon layer, photolithography is used to etch a tunnel through the third dielectric layer down to the lower silicon sacrificial film. When, the second silicon layer is deposited, the silicon also fills the tunnel down to the lower silicon sacrificial film. Photolithography is then used to etch away from the second silicon layer to form an upper silicon sacrificial film for the MEMS device (step 2208).

A fourth dielectric layer is then deposited atop and around the upper silicon sacrificial film (step 2210). Photolithography is then used to create venting holes through the fourth dielectric layer down to the upper silicon sacrificial film (step 2212). The upper and lower silicon sacrificial film is then vented out through the venting holes (step 2214). In the exemplary embodiment, a chemical agent, xenon diflouride, is inserted into the venting holes, however, in other embodiments, another chemical agent may be used. The xenon diflouride reacts with the upper and lower silicon sacrificial film forming xenon gas and silicon tetraflouride gas, which is vented out through the venting holes, leaving an upper and lower cavity. The chemical agent does not affect dielectric material so the third and fourth dielectric layers remain unaffected. Once the lower and upper silicon sacrificial film has been removed, dielectric is deposited into the venting holes to seal them (step 2216).

Figure 23:
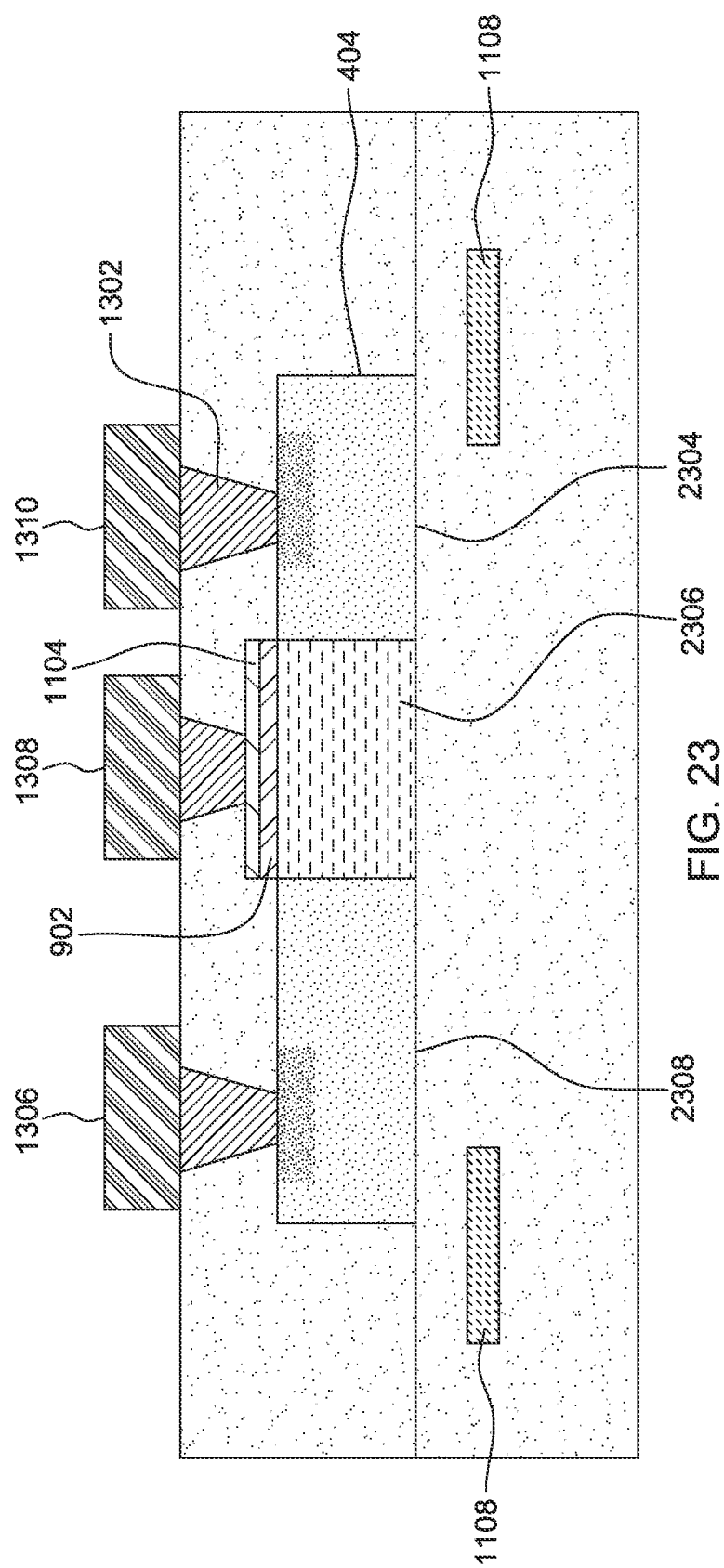
FIG. 23 depicts a MOSFET device featuring a metal gate fabricated via the process described in FIGS. 17 and 18, in accordance with an embodiment of the invention.
Figure 24:
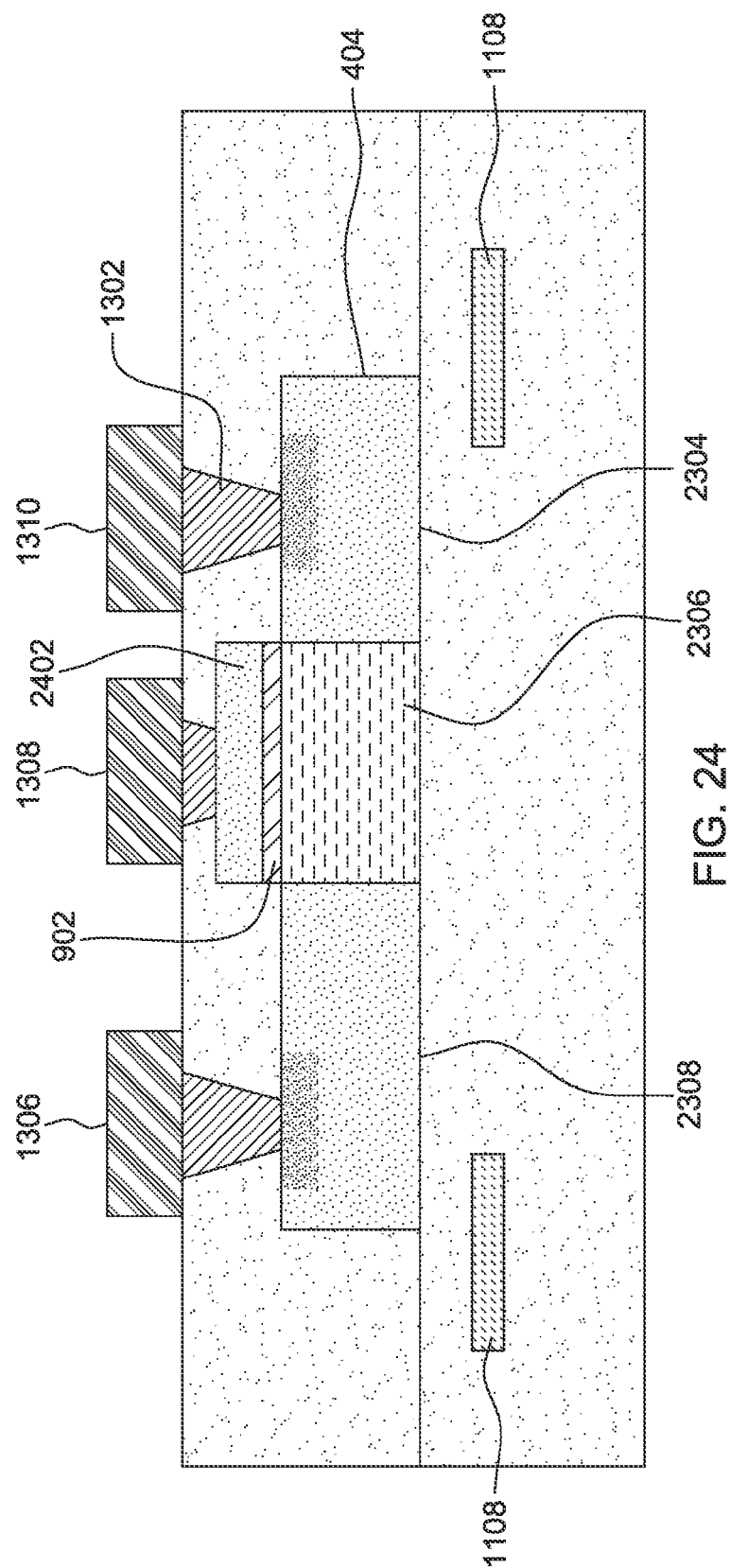
FIG. 24 depicts a MOSFET device featuring a poly-silicon gate fabricated via the process described in FIGS. 17 and 18, in accordance with an embodiment of the invention.

FIGS. 23 and 24 depict two embodiments of a MOSFET device fabricated by way of performing the steps illustrated in FIGS. 1 through 22. FIG. 23 depicts a MOSFET device with metal gate 1104. The doped portion of silicon film 404 is depicted by source region 2304 and drain region 2308. The un-doped portion of silicon film 404 is depicted by region 2306. FIG. 24 depicts a MOSFET device with poly-silicon gate 2402.

Figure 25:
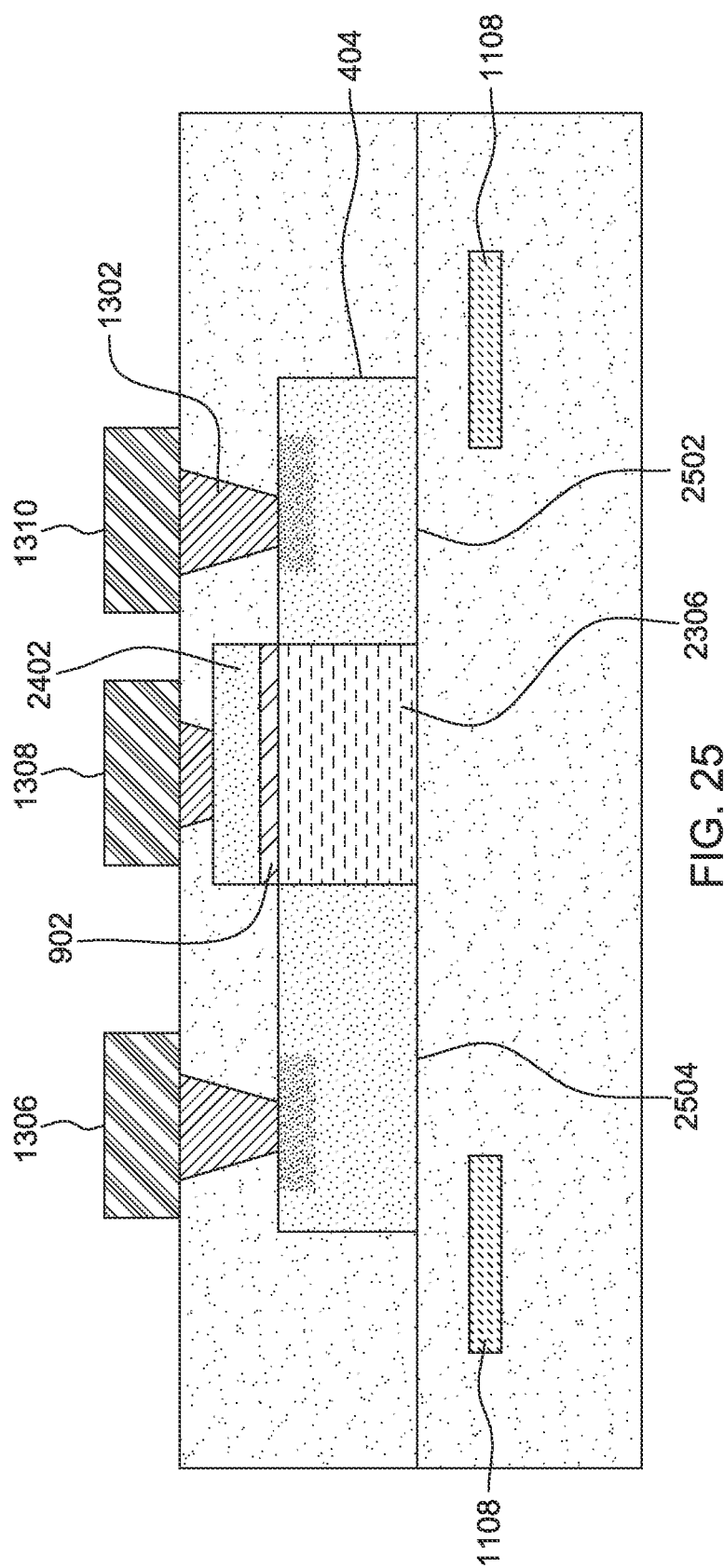
FIG. 25 depicts an ESD diode device featuring a poly-silicon gate fabricated via the process described in FIGS. 17 and 18, in accordance with an embodiment of the invention.

FIG. 25 depicts an ESD diode device fabricated in place of the MOSFET device by way of performing the steps illustrated in FIGS. 1 through 22. FIG. 25 depicts an ESD diode with poly-silicon gate 2402, however, anode region 2504 and cathode region 2502 are present in the place of source region 2304 and drain region 2308. Anode region 2504 is formed by doping with a p-type element, such as boron, and cathode region 2502 is formed by doping with an n-type element, such as phosphorus.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having described preferred embodiments of a tunable semiconductor device (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. A semiconductor device comprising:
   at least one MEMS device, wherein the at least one MEMS device is created during a back end of line process, each of the at least one MEMS device including: (i) at least one electrode; (ii) at least one empty cavity; and (iii) at least one via; and
   at least one MOS device, wherein the at least one MOS device is created during a back end of line process, each of the at least one MOS device including: (i) at least one electrode; (ii) at least one layer of semiconductor; (iii) at least one via; and (iv) at least one insulator, wherein the at least one layer of semiconductor is formed above a one or more layers that including wiring.

2. The semiconductor device of claim 1, further comprising at least one layer of dielectric material.

3. The semiconductor device of claim 1, further comprising at least one layer of electrically isolated substrate.

4. The semiconductor device of claim 1, wherein the at least one insulator of the MOS device comprises an oxide.

5. The semiconductor device of claim 1, wherein the at least one layer of semiconductor of the MOS device is doped with boron or phosphorus.

6. The semiconductor device of claim 5, wherein laser annealing is used to activate the dopants of the at least one layer of semiconductor of the MOS device.

7. The semiconductor device of claim 1, wherein a conductive material is deposited in the at least one via of the MOS device and the MEMS device.

8. The semiconductor device of claim 1, further comprising at least one metal reflector.

9. The semiconductor device of claim 1, wherein the at least one layer of semiconductor of the MOS device comprises of one or more of silicon, glass or plastic.

* * * * *